(12) United States Patent
Yamanaka

(10) Patent No.: US 7,531,951 B2
(45) Date of Patent: May 12, 2009

(54) DISPLAY DEVICE

(75) Inventor: Shigetsugu Yamanaka, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 643 days.

(21) Appl. No.: 11/254,085

(22) Filed: Oct. 19, 2005

(65) Prior Publication Data

US 2006/0087227 A1 Apr. 27, 2006

(30) Foreign Application Priority Data

Oct. 22, 2004 (JP) ............................. 2004-307701

(51) Int. Cl.
*G09G 5/02* (2006.01)
*G09G 3/32* (2006.01)
*G09G 3/20* (2006.01)
*H05B 33/00* (2006.01)

(52) U.S. Cl. ....................... 313/461; 348/790; 348/800; 349/95

(58) Field of Classification Search ....................... None
See application file for complete search history.

(56) References Cited

U.S. PATENT DOCUMENTS 5,144,288 A * 9/1992 Hamada et al. ............. 349/109
6,163,349 A * 12/2000 Nakanishi et al. ............. 349/5
6,870,584 B2 * 3/2005 Kawase et al. ............... 349/106
7,145,624 B2 * 12/2006 Kubo et al. .................. 349/146

FOREIGN PATENT DOCUMENTS

| JP | 10-039791 A | 2/1998 |
| JP | 2002-221917 | 8/2002 |
| JP | 2004-102292 A | 4/2004 |

OTHER PUBLICATIONS

Official Communication issued in corresponding Japanese Patent Application No. 2004-307701, mailed Sep. 19, 2006.

\* cited by examiner

*Primary Examiner*—Ashok Patel
(74) *Attorney, Agent, or Firm*—Keating & Bennett, LLP

(57) ABSTRACT

An organic EL display device is provided with at least three light emitting regions. A first side of a virtual rectangle is in contact with part of the boundary of the first light emitting region. A second side of the virtual rectangle that is parallel or substantially parallel to the first side is in contact with portions of the boundaries of the second and third light emitting regions. A third side of the virtual rectangle that is perpendicular or substantially perpendicular to the first side is in contact with portions of the boundaries of the first and second light emitting regions. A fourth side of the virtual rectangle that is parallel or substantially parallel to the third side is in contact with portions of the boundaries of the first and third light emitting regions. The second and third light emitting regions have substantially the same width in the direction of extension of the third side.

21 Claims, 18 Drawing Sheets

DISPLAY DEVICE

CROSS-REFERENCE TO RELATED APPLICATION

This non-provisional application claims priority under 35 U.S.C. §119(a) of Japanese Patent Application No. 2004-307701 filed in Japan on Oct. 22, 2004, the entire contents of which are hereby incorporated by reference.

BACKGROUND OF THE INVENTION

1. Field of the Invention

The present invention relates to a display device, and more particularly, the present invention relates to an organic EL display device that includes at least three light emitting regions arranged to achieve high quality image display by providing smooth vertical lines and slanting lines.

2. Description of Related Art

As a wide variety of information processing apparatuses have been developed in recent years, there is a growing demand for flat display devices having a reduced thickness and which operate with lower power consumption than conventional cathode-ray tube (CRT) display devices. Examples of the flat display devices include, for example, liquid crystal display devices and electroluminescent display devices (hereinafter referred to as EL display devices). Among them, the EL display devices have been actively studied because of their features of a low voltage drive system, being made of solid material only, quick response and a self-light-emitting property.

In general, a full-color EL display device includes a display region in which light emitting regions R which emit red (R) light, light emitting regions G which emit green (G) light and light emitting regions B which emit blue (B) light are regularly arranged. For example, Japanese Unexamined Patent Publication No. 2002-221917 discloses a true delta configuration of the light emitting regions.

FIG. 19 is a schematic sectional view illustrating an organic EL display device 5 of Japanese Unexamined Patent Publication No. 2002-221917 including the light emitting regions R, G and B arranged in the true delta configuration.

In the organic EL display device 5 including the light emitting regions R, G and B arranged in the true delta configuration, wherein pixels, each of includes a set of the light emitting regions R, G and B (surrounded by a thick line in FIG. 19), are arranged in a staggered configuration. In the organic EL display device 5, the light emitting regions which emit the same color light are not adjacent to each other. Instead, three light emitting regions which emit different color lights, respectively, are adjacent to each other. The three adjacent light emitting regions are arranged such that the centers of gravity thereof form a triangle, which is a regular triangle.

With the organic EL display device 5 including the light emitting regions arranged in the true delta configuration, smooth slanting lines are displayed. Therefore, the organic EL display device 5 allows display of pictures composed of many slanting lines.

FIG. 20 is a conceptual view illustrating a vertical line produced by the organic EL display device 5. As shown in FIG. 20, the pixels in the organic EL display device 5 are arranged in the form of T (or inverted T). That is, the three light emitting regions R, G and B form or are surrounded by a virtual T (or inverted T) as shown by the dark peripheral lines surrounding each set of the three light emitting regions R, G and B in FIG. 19. Therefore, a plurality of jagged edges occurs along a vertical line extending through the center of the T or inverted T arrangement. Thus, the organic EL display device 5 including the light emitting regions arranged in the true delta configuration cannot have smooth, non-jagged vertical lines.

SUMMARY OF THE INVENTION

In order to overcome the problems described above, preferred embodiments of the present invention provide a display device which achieves high quality image display by providing smooth vertical lines and slanting lines.

A display device according to a first preferred embodiment of the present invention includes at least three light emitting regions including a first light emitting region, a second light emitting region and a third light emitting region. At least two of the at least three light emitting regions are different in area from each other. Each of the at least three light emitting regions is preferably substantially rectangular. The at least three light emitting regions are surrounded by a virtual rectangle and a first side of the virtual rectangle is in contact with part of the boundary of the first light emitting region. A second side of the virtual rectangle that is substantially parallel to the first side is in contact with parts of the boundaries of the second and third light emitting regions. A third side of the virtual rectangle that is substantially perpendicular to the first side is in contact with parts of the boundaries of the first and second light emitting regions. A fourth side of the virtual rectangle that is substantially parallel to the third side is in contact with parts of the boundaries of the first and third light emitting regions. The second and third light emitting regions preferably have substantially the same width in the direction of extension of the third side.

A display device according to a second preferred embodiment of the present invention includes at least four light emitting regions including a first light emitting region, a second light emitting region, a third light emitting region and a fourth light emitting region. At least two of the at least four light emitting regions are different in area from each other. Each of the at least four light emitting regions is preferably substantially rectangular. The at least four light emitting regions are surrounded by a virtual rectangle and a first side of the virtual rectangle is in contact with parts of the boundaries of the first and second light emitting regions. A second side of the virtual rectangle that is substantially parallel to the first side is in contact with parts of the boundaries of the third and fourth light emitting regions. A third side of the virtual rectangle that is substantially perpendicular to the first side is in contact with parts of the boundaries of the first and third light emitting regions. A fourth side of the virtual rectangle parallel to the third side is in contact with parts of the boundaries of the second and fourth light emitting regions. The first and second light emitting regions preferably have the same width in the direction of extension of the third side. The third and fourth light emitting regions preferably have the same width in the direction of extension of the third side.

The display device according to the first preferred embodiment of the present invention may further include a fourth light emitting region which is arranged within the virtual rectangle. It is preferable that the fourth light emitting region is substantially rectangular, the fourth light emitting region has a side which is substantially parallel to the first side and the center of gravity of the fourth light emitting region is located within a polygon formed by connecting the centers of gravity of the at least three light emitting regions. The fourth light emitting region preferably shows the highest luminance when it emits white light.

FIG. 19 is a schematic plan view illustrating an organic EL display device including the light emitting regions arranged in the true delta configuration.

FIG. 20 is a conceptual diagram illustrating a vertical line produced by the organic EL display device including the light emitting regions arranged in the true delta configuration.

DETAILED DESCRIPTION OF PREFERRED EMBODIMENTS

Hereinafter, with reference to the drawings, preferred embodiments of the present invention are described in detail.

Figure 1:
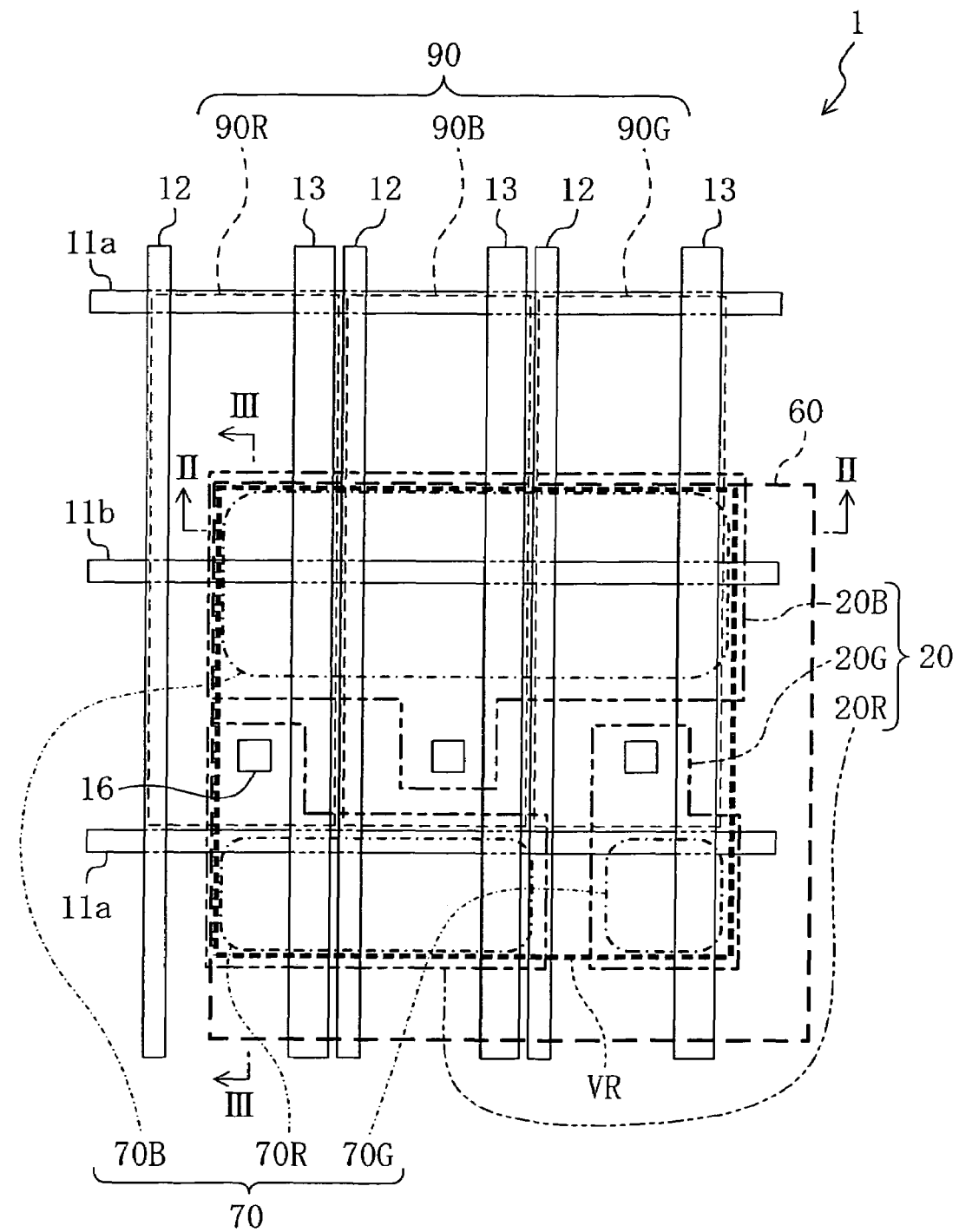
FIG. 1 is a schematic plan view illustrating the configuration of an organic EL display device according to a first preferred embodiment of the present invention.
Figure 2:
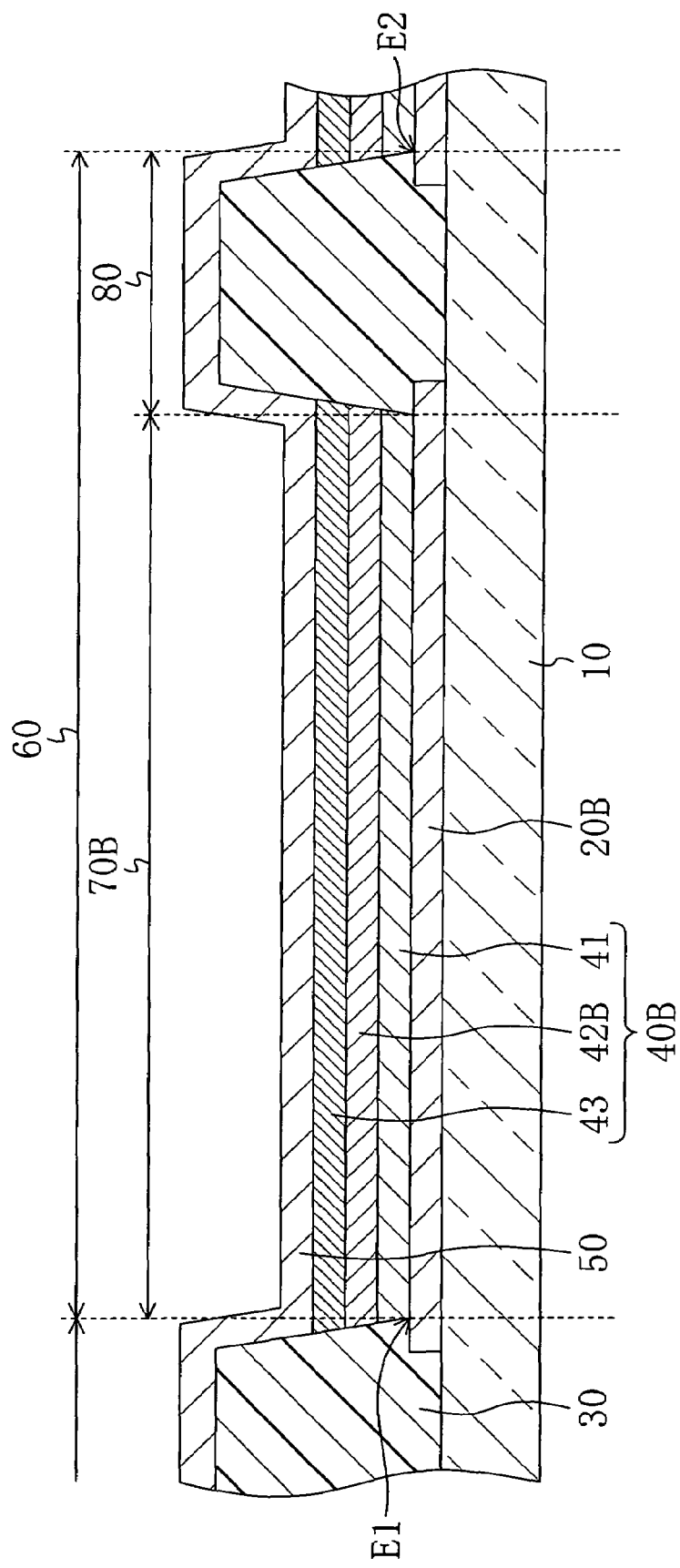
FIG. 2 is a schematic sectional view of the organic EL display device taken along the line II-II shown in FIG. 1.
Figure 3:
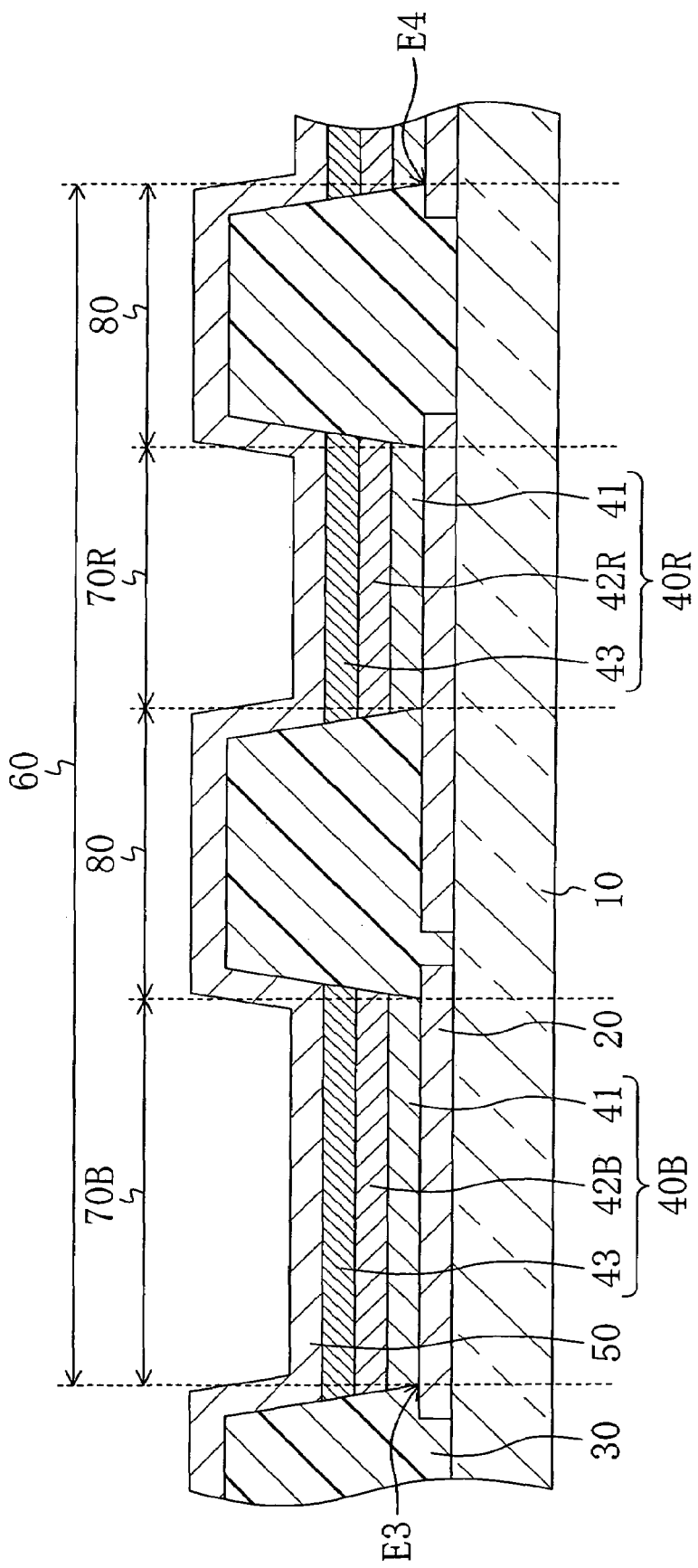
FIG. 3 is a schematic sectional view of the organic EL display device taken along the line III-III shown in FIG. 1.

FIG. 1 is a schematic plan view illustrating the configuration of an organic EL display device 1 according to a first preferred embodiment of the present invention, FIG. 2 is a schematic sectional view of the organic EL display device 1 taken along the line II-II shown in FIG. 1 and FIG. 3 is a schematic sectional view of the organic EL display device 1 taken along the line III-III shown in FIG. 1. The organic EL display device 1 includes an active matrix substrate 10, a plurality of subpixel electrodes 20, a bank (barrier) 30, a plurality of organic layers 40 and a shared upper electrode 50. The subpixel electrodes 20 (each including a set of subpixel electrodes 20R, 20G and 20B) are arranged on the surface of the active matrix substrate 10 in a matrix configuration. The bank 30 separates the subpixel electrodes 20R, 20G and 20B from each other. The organic layers 40 are provided on the subpixel electrodes 20R, 20G and 20B. Further, the shared upper electrode 50 covers the bank 30 and the organic layers 40.

In the following description, similar components identified with the same reference numeral and different alphabetical references may be indicated by the common reference numeral only for general explanation. For example, organic layers 40R, 40G and 40B may be simply referred to as organic layers 40.

The active matrix substrate 10 is provided with a plurality of gate signal lines 11, a plurality of source signal lines 12 and a plurality of current supply lines 13. The source signal lines 12 extend parallel to each other. The gate signal lines 11 extend parallel to each other and intersect with the source signal lines 12. The current supply lines 13 extend parallel to each other in the direction of extension of the source signal lines 12. The gate signal lines 11, source signal lines 12 and current supply lines 13 are preferably arranged in the form of a straight line, respectively. This allows reduction in length of the lines 11, 12 and 13 as compared with the case where the lines 11, 12 and 13 are curved. Therefore, resistance applied to the lines 11, 12 and 13 is minimized.

Further, under the condition of continuous current application, the lines 11, 12 and 13 (especially the current supply lines 13) are less likely to cause electromigration (electrolytic corrosion) than if the lines 11, 12 and 13 are curved. Thus, the straight lines 11, 12 and 13 are effectively prevented from experiencing a decrease in width and a break therein.

Each of the organic layers 40 includes a hole transport layer 41, an electroluminescent light emitting layer (hereinafter referred to as "EL light emitting layer) 42 and an electron transfer layer 43 formed on the EL light emitting layer 42. Portions of the organic EL display device 1 where the organic layer 40, subpixel electrode 20 and shared upper electrode 50 overlap each other are defined as light emitting regions 70.

The light emitting regions 70 are divided into three types, depending on the color of light emitted by the EL light emitting layer 42 formed therein. More specifically, the light emitting regions 70 are divided into: light emitting regions 70R including EL light emitting layers 42R, respectively, for emitting red (R) light; light emitting regions 70G including EL light emitting layers 42G, respectively, for emitting green (G) light; and light emitting regions 70B including EL light emitting layers 42B, respectively, for emitting blue (B) light.

The subpixel electrodes 20R, 20G and 20B are connected to subpixel circuits 90 formed in the active matrix substrate 10 via through holes 16.

Figure 4:
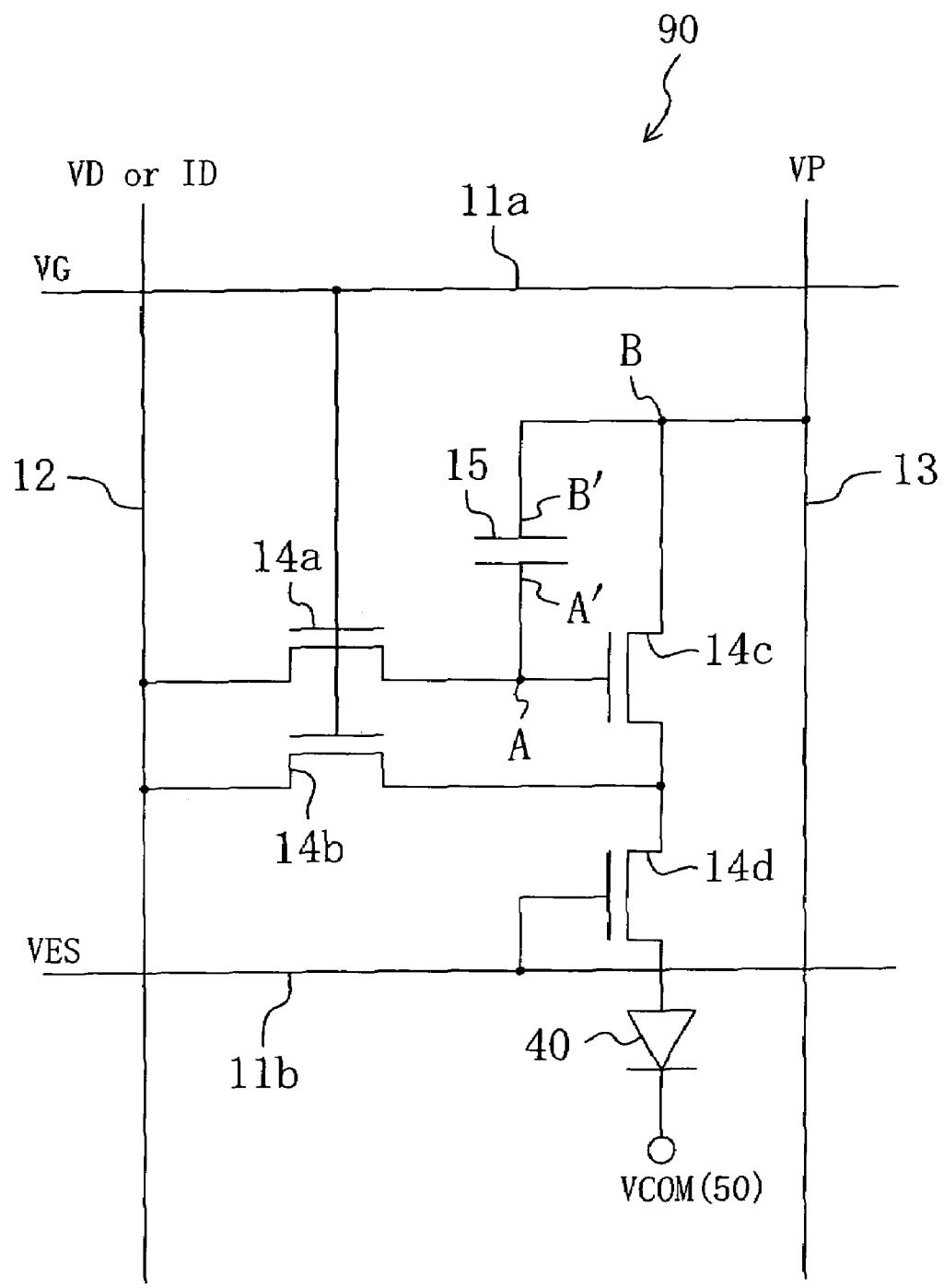
FIG. 4 is a circuit diagram illustrating the configuration of subpixel circuits.

FIG. 4 shows a circuit diagram illustrating the configuration of the subpixel circuit 90.

As shown in FIG. 4, each of the subpixel circuits 90 includes TFTs 14a to 14d and a supplementary capacitor element (Cs) 15. The subpixel circuit 90 is connected to the source signal line 12, gate signal line 11 and current supply line 13. The gate signal lines 11 are divided into gate signal lines 11a and 11b. For line selection, the gate signal line 11a introduces data to the subpixel circuit 90 to input the data into the source signal line 12. The gate signal line 11b inputs an ON or OFF signal into the TFT 14d.

Figure 5:
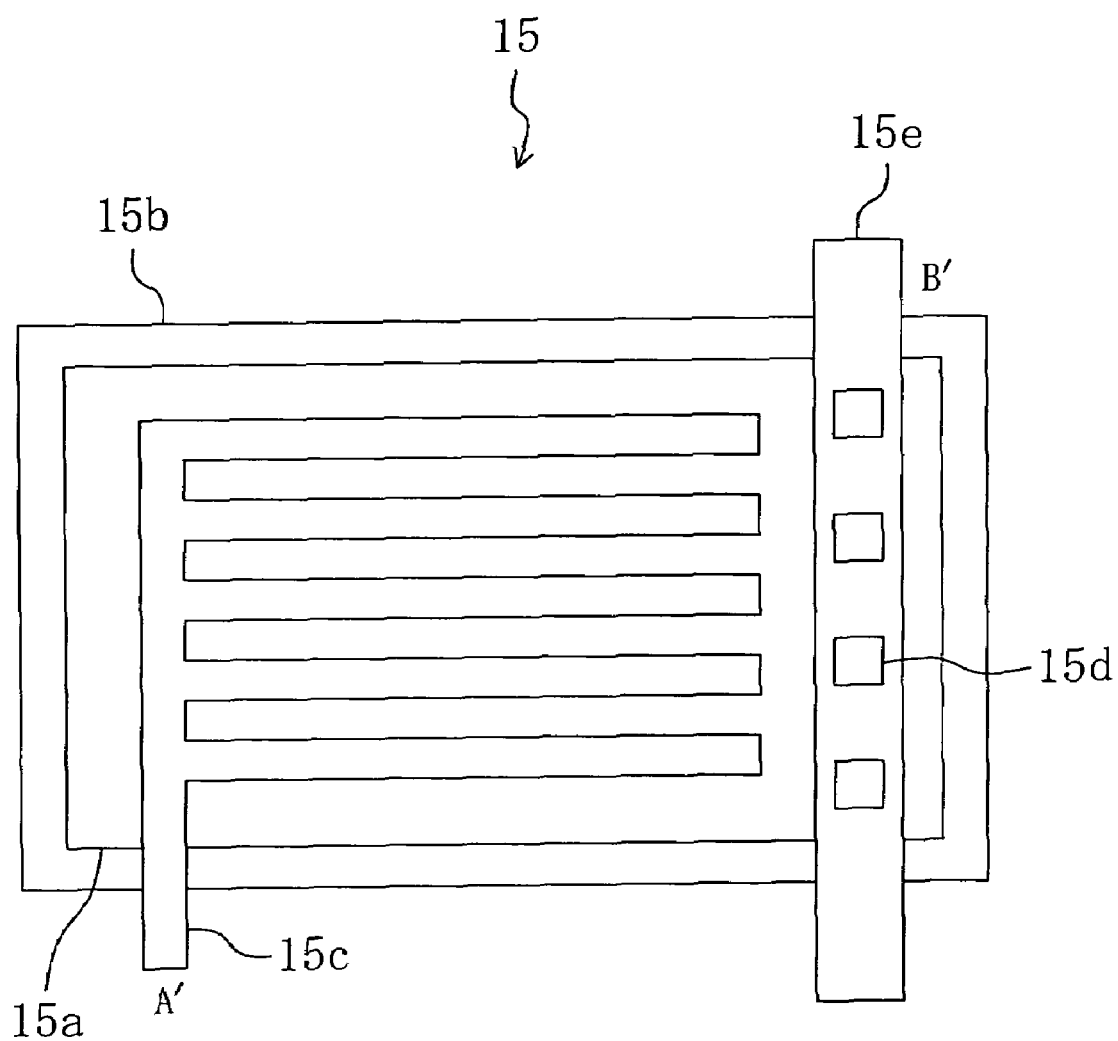
FIG. 5 is a schematic plan view illustrating the configuration of a supplementary capacitor element (Cs) provided for each subpixel circuit.

FIG. 5 is a schematic plan view illustrating the configuration of the supplementary capacitor element (Cs) 15 provided in each subpixel circuit 90.

The supplementary capacitor element 15 preferably includes a silicon layer 15a, an impurity-doped region 15b, a first electrode 15c and a second electrode 15e. The impurity-doped region 15b covers the silicon layer 15a and the first electrode 15c is disposed above the silicon layer 15a. The second electrode 15e is connected to the top surface of the silicon layer 15a via a contact 15d. An insulating layer (not shown) is provided between the silicon layer 15a and the first electrode 15c. Point A' of the first electrode 15a shown in FIG. 5 is connected to point A shown in FIG. 4, while point B' of the second electrode 15e shown in FIG. 5 is connected to point B shown in FIG. 4.

In the first preferred embodiment, the first electrode 15c is preferably comb-shaped. Therefore, the area portion of the silicon layer 15a covered with the first electrode 15c is relatively small. This makes it possible to effectively maintain a low electrical resistance value of the silicon layer 15a below the first electrode 15c, thereby reducing a resistance loss of the supplementary capacitor element 15. As a result, data writing into the subpixel circuits 90 is carried out at an increased charge/discharge rate. In particular, for a display panel having a large display region, the increased charge/discharge rate is advantageous in connection with address time.

Hereinafter, a detailed explanation why the comb-shaped first electrode 15c makes it possible to effectively maintain a low level of the electrical resistance value of the silicon layer 15a will be provided. In general, the silicon layer is doped with impurities such as phosphorus after the formation of the first electrode to make the silicon layer conductive. Therefore, if the silicon layer is covered with the first electrode by a large area, the silicon layer is not doped with a sufficient amount of impurities, thereby increasing the resistance value of the silicon layer. This leads to an increase in resistance loss of the supplementary capacitor element.

Where the resistance loss of the supplementary capacitor element is large, the supplementary capacitor element 15 requires a long voltage rise time and a long voltage fall time during charge/discharge thereof when the subpixel circuit 90 is selected by a gate signal. If the voltage rise time and the voltage fall time are long, the potential of the signal input from the source signal line 12 cannot be stored in the supplementary capacitor element 15 during a time period for the selection of the subpixel circuit 90. As a result, data writing cannot be performed sufficiently. This brings about a writing error and a display error.

Due to limitations on the pixel selection time, limitations are also imposed on the number of scanning lines in a screen. In general, image data is updated at about 60 Hz. Therefore, if 720 pixel lines are formed, line selection time $T_{LAT}$ is determined as $1000000/(60\times720)=23.15$ μs. To display a gradation image by scanning the pixels N times within a single frame, line selection time $T_{LAT}$ is 23.15 μs/N. If gradation image display is carried out on a time-sharing basis, scanning is performed about 10 times to display a 8-bit gradation image. That is, data storing must be done within as short a time period as about 2.32 μs. However, if the supplementary capacitor element having a large resistance loss is used, it is difficult to complete data storing within the line selection time of about 2.32 μs.

The subpixel electrodes 20 are capable of implanting holes into the organic layers 40 and may be made of aluminum (Al) or indium tin oxide (ITO).

The bank 30 is preferably arranged to divide the subpixel electrodes 20 from each other, as well as the organic layers 40 disposed thereon. The bank 30 preferably has a substantially trapezoid cross sectional shape. Openings formed in the bank 30 (in which the subpixel electrodes 20 are exposed) are preferably substantially rectangular. Therefore, regions where the subpixel electrodes 20 and the organic layers 40 overlap each other are preferably substantially rectangular, and so are the light emitting regions 70.

In the present specification, the term "rectangular" indicates a square or an elongated rectangle. Further, the term "substantially rectangular" indicates a rectangle or a rectangle whose corners are beveled or not quite 90 degrees. The corners may be beveled such that the resulting corners form an angle larger than 90 degrees or a curve. Further, the corners may also be formed of a combination of curves and obtuse corners.

Each of the organic layers 40 preferably includes the hole transport layer 41, EL light emitting layer 42 and electron transport layer 43. However, the present invention is not limited thereto. For example, the organic layer 40 may be composed of the EL light emitting layer 42 only. The organic layer 40 may also be composed of the EL light emitting layer 42 and one or two of a hole implantation layer, the hole transport layer 41, the electron transport layer 43 and an electron implantation layer.

The hole transport layer 41 improves transport efficiency of holes implanted from the subpixel electrode 20 into the EL light emitting layer 42. Examples of hole transporting material to be contained in the hole transport layer 41 include a porphyrin compound and other suitable material.

The EL light emitting layer 42 is capable of causing light emission by combining holes implanted from the subpixel electrode 20 and electrons implanted from the shared upper electrode 50. For example, a complex of (8-hydroxyquinolinate) aluminum may be used as light emitting material to be contained in the EL light emitting layer 42.

The electron transport layer 43 is capable of improving the transport efficiency of electrons implanted from the shared upper electrode 50 to the EL light emitting layer 42. For example, the electron transport layer 43 may be made of a carbazole derivative.

The shared upper electrode 50 is capable of implanting electrons into the EL light emitting layer 42. Material for the shared upper electrode 50 may be silver (Ag) or aluminum (Al).

Figure 6A:
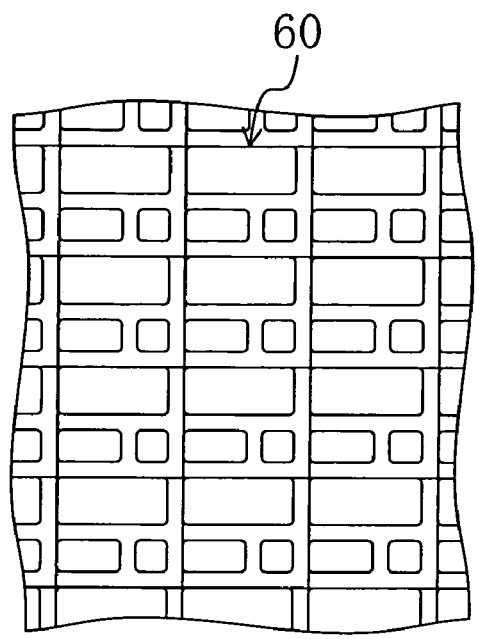
FIGS. 6A and 6B are plan views illustrating the configuration of light emitting regions in the organic EL display device of the first preferred embodiment of the present invention.
Figure 6B:
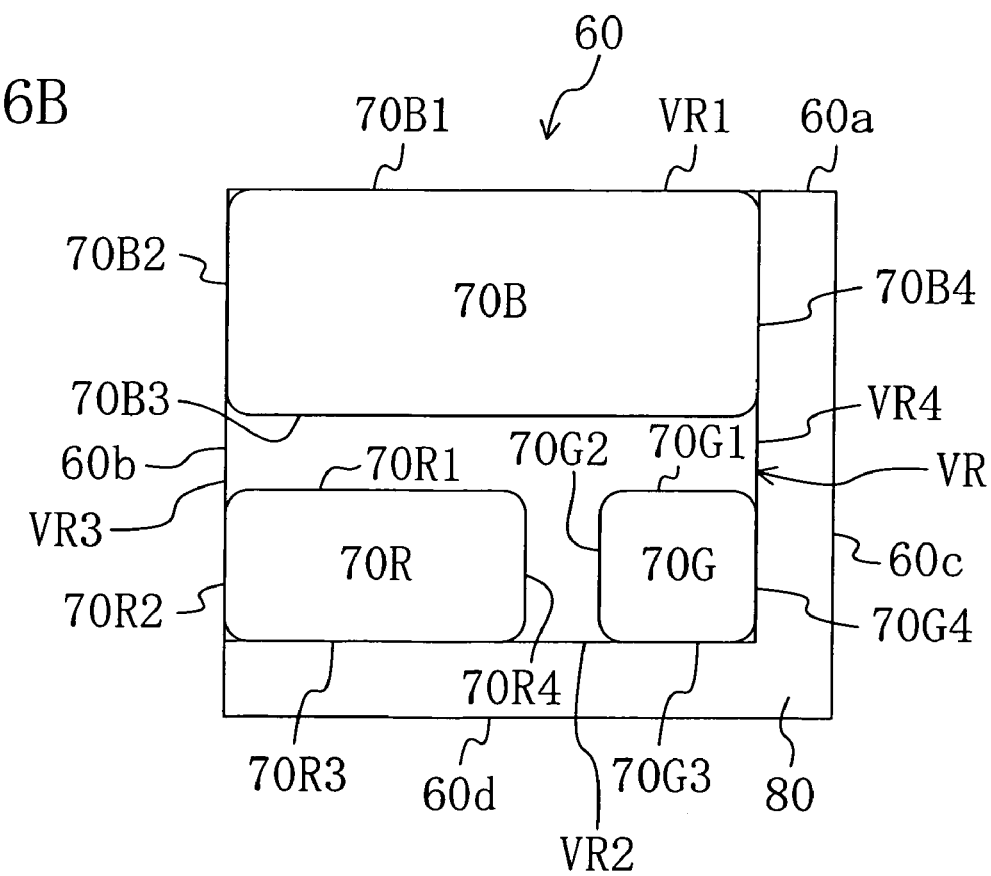

FIGS. 6A and 6B are plan views illustrating the configuration of the light emitting regions 70 in the organic EL display device 1.

A light emitting region 70R, a light emitting region 70G and a light emitting region 70B are different in area from each other. The light emitting region 70B preferably has the largest area, while the light emitting region 70G preferably has the smallest area, for example. In general, the light emitting regions 70R, 70G and 70B have different luminance attenuation characteristics (a gradual decrease in luminance of the light emitting regions 70R, 70G and 70B while white display continues to be performed on the entire display region of the organic EL display device 1). If the light emitting regions 70R, 70G and 70B have the same area as with the conventional device shown in FIGS. 19 and 20, the luminance of the light emitting region 70B is attenuated at the highest rate, while that of the light emitting region 70G is attenuated at the lowest rate.

As in the organic EL display device 1, it is preferred that the light emitting region 70B which is the highest in luminance attenuation rate is provided with the largest area, while the light emitting region 70G which is the lowest in luminance attenuation rate is provided with the smallest area. By so doing, a voltage applied to the light emitting region 70B whose luminance decreases at a relatively high rate is reduced, thereby slowing the luminance attenuation of the light emitting region 70B. As a result, the light emitting regions 70R, 70G and 70B are more equalized in luminance attenuation rate, thereby efficiently preventing variations in color balance over operating time. Thus, the above-described configuration allows an increase in the life of the organic EL display device 1.

In the organic EL display device 1, the substantially rectangular light emitting regions 70R, 70G and 70B are surrounded by a virtual rectangle VR, as seen in FIG. 6B. A first side VR1 of the virtual rectangle VR is in contact with a first side 70B1 of the light emitting region 70B. A second side VR2 of the virtual rectangle VR that is parallel or substantially parallel to the first side VR1 is in contact with a third side 70R3 of the light emitting region 70R and a third side 70G3 of the light emitting region 70G. A third side VR3 of the virtual rectangle VR that is perpendicular or substantially perpendicular to the first side VR1 is in contact with a second side 70B2 of the light emitting region 70B and a second side 70R2 of the light emitting region 70R. A fourth side VR4 of the virtual rectangle VR that is parallel or substantially parallel to the third side VR3 is in contact with a fourth side 70B4 of the light emitting region 70B and a fourth side 70G4 of the light emitting region 70G.

A third side 70B3 of the light emitting region 70B faces a first side 70R1 of the light emitting region 70R and a first side 70G1 of the light emitting region 70G. Further, a fourth side 70R4 of the light emitting region 70R faces a second side 70G2 of the light emitting region 70G. A gap between the light emitting region 70B and the light emitting region 70R or 70G, as well as a gap between the light emitting regions 70G and 70R, are defined as non-emission regions.

In the present specification, the arrangement of the light emitting regions as shown in FIGS. 6A and 6B and as described above is referred to as an "almost delta configuration". The almost delta configuration is not limited to the arrangement of the light emitting regions shown in FIGS. 6A and 6B. For example, a fourth light emitting region may be provided in the virtual rectangle VR in addition to the light emitting regions 70R, 70G and 70B. What is different from the conventional true delta configuration is that the centers of gravity of the light emitting regions 70R, 70G and 70B in the almost delta configuration of the present invention form a triangle but not a regular triangle, and that the light emitting regions 70R, 70G and 70B form or are surrounded by a virtual rectangle VR, instead of a virtual T (or inverted T) as with the three light emitting regions R, G and B in the conventional true delta arrangement shown in FIG. 19.

The organic EL display device 1 including the light emitting regions 70R, 70G and 70B arranged in the almost delta configuration achieves a higher aperture ratio than the conventional organic EL display device including the light emitting regions having a stripe configuration. Hereinafter, with reference to the drawings, a detailed explanation of why the higher aperture ratio is obtained with the present invention will be provided.

In advance of the explanation about the aperture ratio, the definition of "pixel" in the present specification is explained. Pixels 60 are rectangular and arranged in a matrix configuration in a display region of the organic EL display device 1. Each of the pixels 60 is a minimum unit for dot matrix display in the organic EL display device 1. As shown in FIGS. 6A and 6B, each of the pixels 60 arranged in the matrix configuration includes the light emitting regions 70R, 70G and 70B. The pixel 60 further includes a region other than the light emitting regions 70R, 70G and 70B (hereinafter the region may be referred to as a non-emission region). Two of the sides of the rectangular pixel 60 are in contact with the virtual rectangle VR. More specifically, as shown in FIG. 6B, a first side 60a of the pixel 60 is in contact with the first side VR1 of the virtual rectangle VR, while a second side 60b of the pixel 60 that is perpendicular or substantially perpendicular to the first side 60a is in contact with the third side VR3 of the virtual rectangle VR. A third side 60c of the pixel 60 that is parallel or substantially parallel to the second side 60b and a fourth side 60d that is parallel or substantially parallel to the first side 60a of the pixel 60 are not in contact with the virtual rectangle VR. In other words, the first and second sides 60a and 60b of the pixel 60 are in contact with the light emitting regions, whereas the non-emission region is provided in a portion of the pixel 60 near the third and fourth sides 60c and 60d. Referring to FIG. 2, the first side 60a coincides with the edge E1 of the bank 30, while the fourth side 60d coincides with the edge E2 of the bank 30. Further, referring to FIG. 3, the first side 60a and the fourth side 60d coincide with the edge E3 and the edge E4 of the bank 30, respectively.

Figure 7:
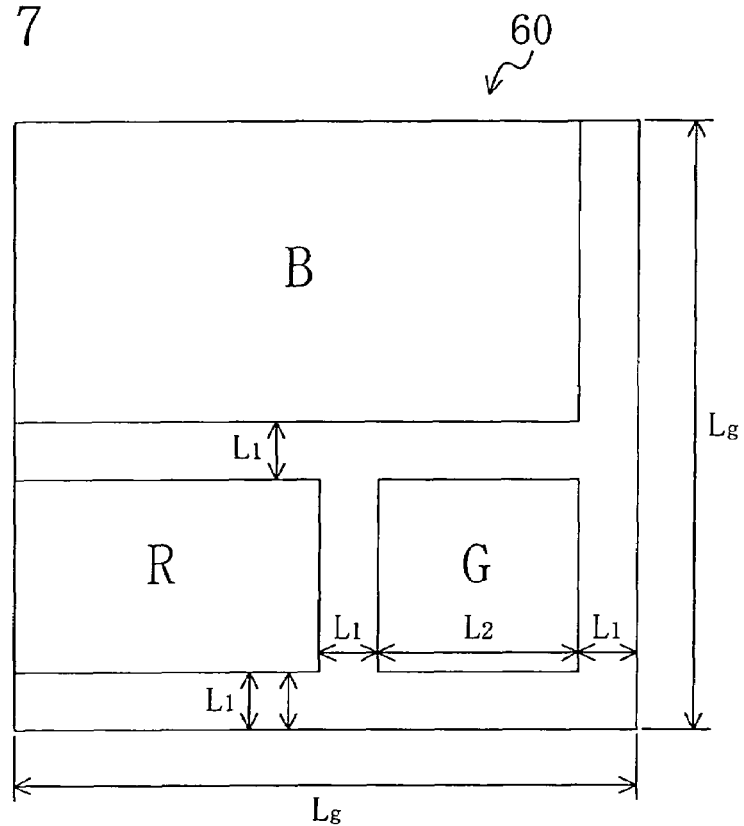
FIG. 7 is a conceptual diagram illustrating the light emitting regions arranged in an almost delta configuration.

FIG. 7 is a conceptual diagram illustrating the configuration of the pixel 60 including the light emitting regions 70R, 70G and 70B arranged in the almost delta configuration. More specifically, the light emitting regions 70R, 70G and 70B are arranged in the almost delta configuration such that they have regular intervals ($L_1$) from each other in a square pixel 60 having a length $L_g$ on a side.

Figure 8:
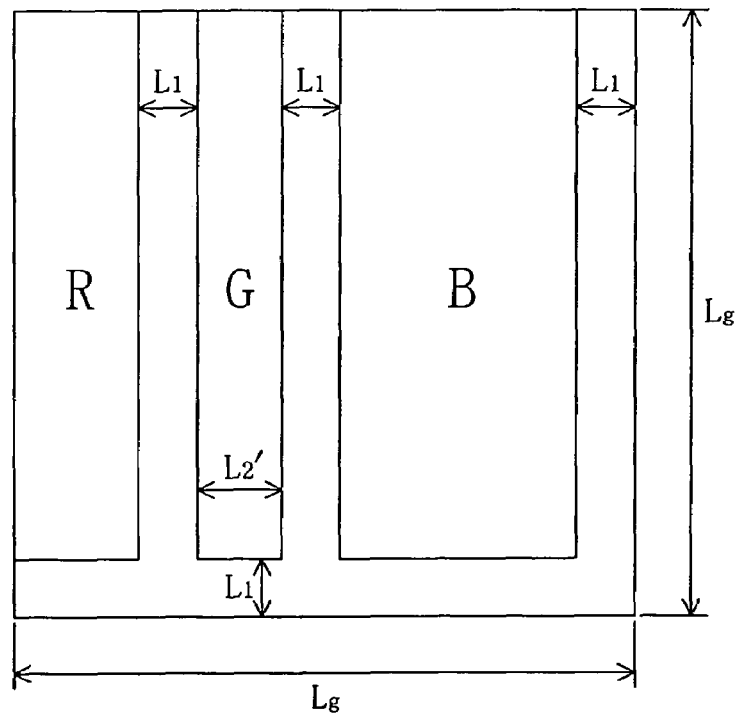
FIG. 8 is a conceptual diagram illustrating the light emitting regions arranged in a stripe configuration.

FIG. 8 is a conceptual diagram illustrating the configuration of the pixel 60 including the light emitting regions 70R, 70G and 70B arranged in a stripe configuration. More specifically, the light emitting regions 70R, 70G and 70B are arranged in the stripe configuration such that they have regular intervals ($L_1$) from each other in a square pixel 60 having a length $L_g$ on a side.

In FIGS. 7 and 8, the light emitting regions 70R, 70G and 70B have the area ratio of 70R:70G:70B=a:1:β.

In the almost delta configuration shown in FIG. 7, the total area $S_5$ of the light emitting regions 70R, 70G and 70B is calculated by the following formula 1:

$$S_5=(a+1+\beta)(L_g-L_1)(L_g-2L_1)^2/\{(a+1)(L_g-L_1)+\beta(L_g-2L_1)\}. \tag{Formula 1}$$

On the other hand, in the stripe configuration shown in FIG. 8, the total area $S_6$ of the light emitting regions 70R, 70G and 70B is calculated by the following formula 2:

$$S_6=(L_g-3L_1)(L_g-L_1). \tag{Formula 2}$$

Figure 9:
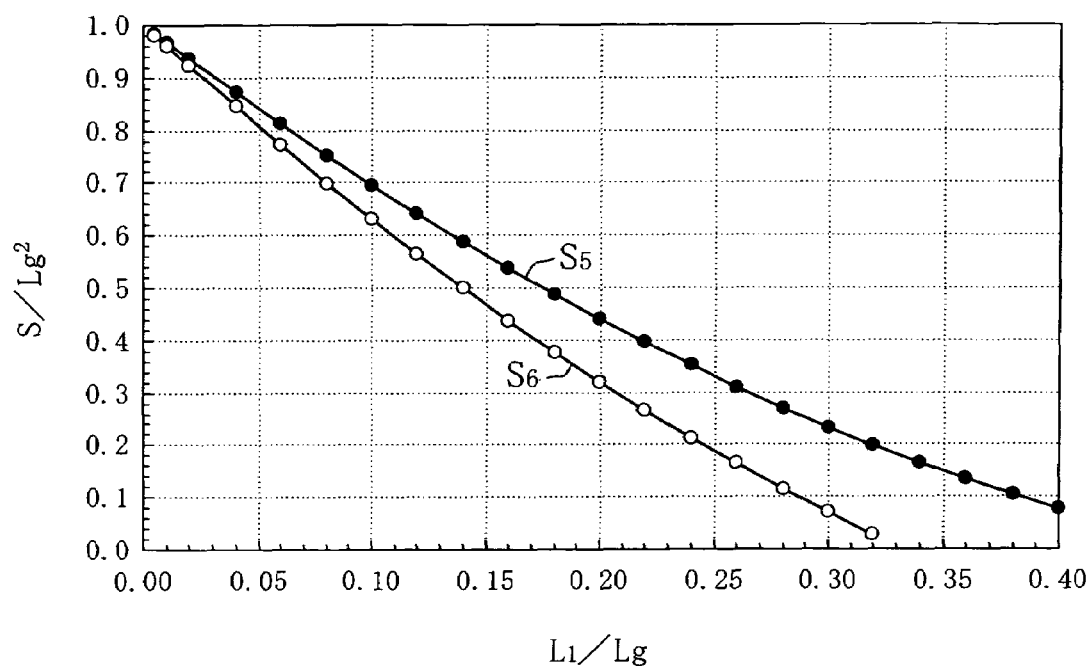
FIG. 9 is a graph illustrating a relationship between the ratio ($L_1/L_g$) of the interval $L_1$ between the light emitting regions to the length $L_g$ of a side of a pixel and the ratio ($S/L_g^2$) of the total area of the light emitting regions (S) to the pixel area ($L_g^2$).

FIG. 9 is a graph illustrating a relationship between the ratio ($L_1/L_g$) of the interval $L_1$ between subpixels (light emitting regions) to the length $L_g$ of a side of the pixel and the ratio ($S/L_g^2$) of the subpixel area $S_5$ or $S_6$ (S) to the pixel area ($L_g^2$). In the graph of FIG. 9, a is 2 and β is 8.

As shown in FIG. 9, regardless of the value of $L_1/L_g$, $S_5$ is always larger than $S_6$. Therefore, the almost delta configuration allows an increase of the ratio of the total area of the light emitting regions to the pixel area as compared to the stripe configuration (parallel arrangement). Thus, if the light emitting regions are arranged in the almost delta configuration, the organic EL display device is provided with a large aperture ratio. Here, the explanation is given under the conditions that a is 2 and β is 8, but the value $S_5$ is always larger than the value $S_6$ even if the values a and β are in any relationship.

Further, in the almost delta configuration as shown in FIG. 7, each of the light emitting regions 70R, 70G and 70B preferably has a substantially square-shaped configuration. That is, the longer sides and the shorter sides of each light emitting region are much less different from each other. As a result, the shorter sides L2 of the light emitting region G of the smallest area become longer than the shorter sides L2' of the light emitting region G in the stripe configuration shown in FIG. 8.

When ink jet printing is used to form the organic layers 40, higher accuracy is required in dropping ink droplets as the length of the shorter sides of the light emitting regions is shorter. On the other hand, when the length of the shorter sides of the light emitting regions is long, the accuracy in dropping the ink droplets may be low. Thus, the organic EL display device 1 including the light emitting regions 70R, 70G and 70B arranged in the almost delta configuration can be formed by ink jet printing with ease at relatively low cost.

Next, an explanation of the effect on visual display of the organic EL display device 1 including the light emitting regions 70R, 70G and 70B arranged in the almost delta configuration will be provided.

Figure 10:
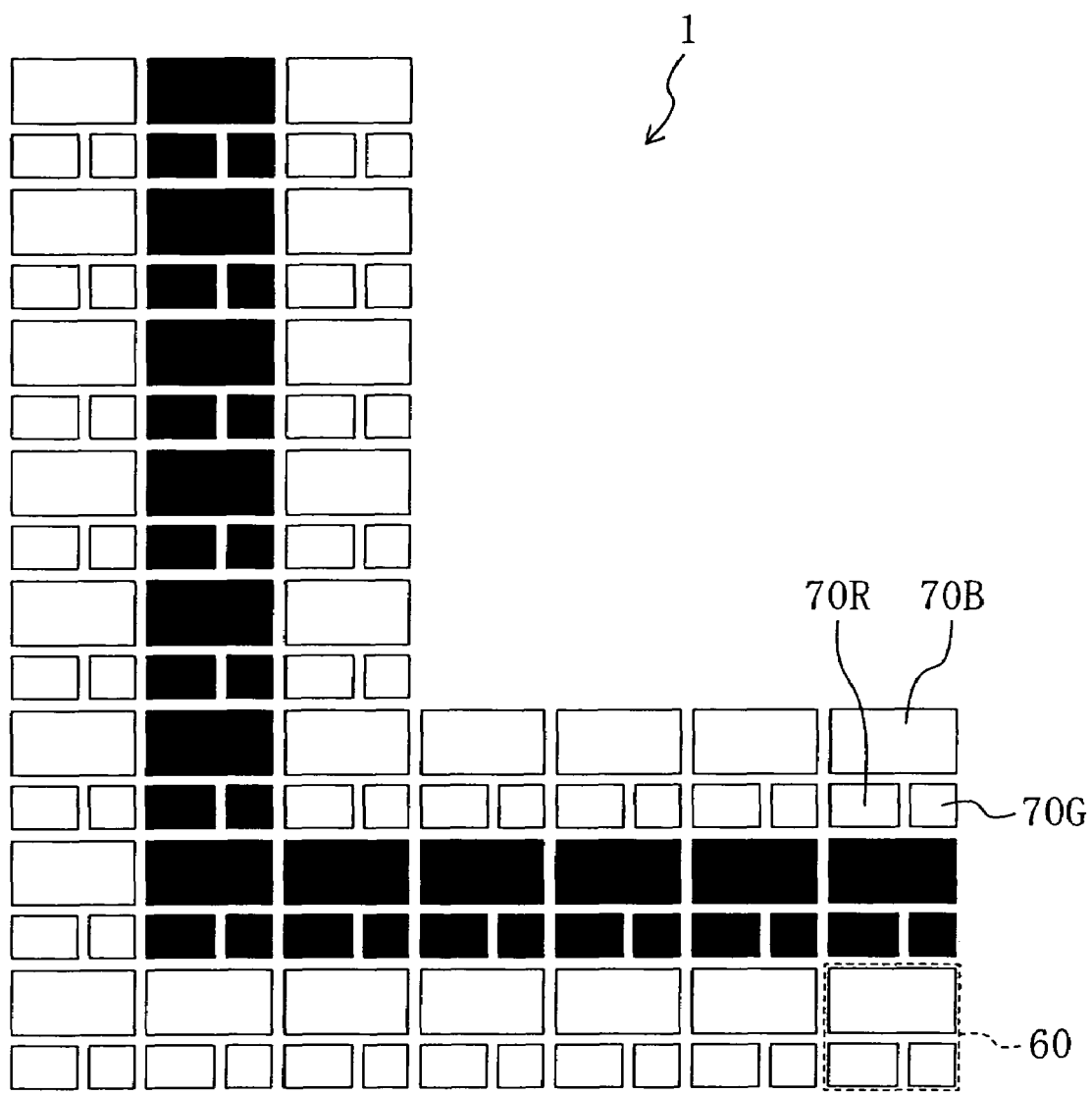
FIG. 10 is a conceptual diagram illustrating the letter L produced by the organic EL display device including the light emitting regions arranged in the almost delta configuration.

FIG. 10 is a conceptual diagram illustrating the letter L produced by the organic EL display device 1 including the light emitting regions 70R, 70G and 70B arranged in the almost delta configuration of the present invention.

Figure 11:
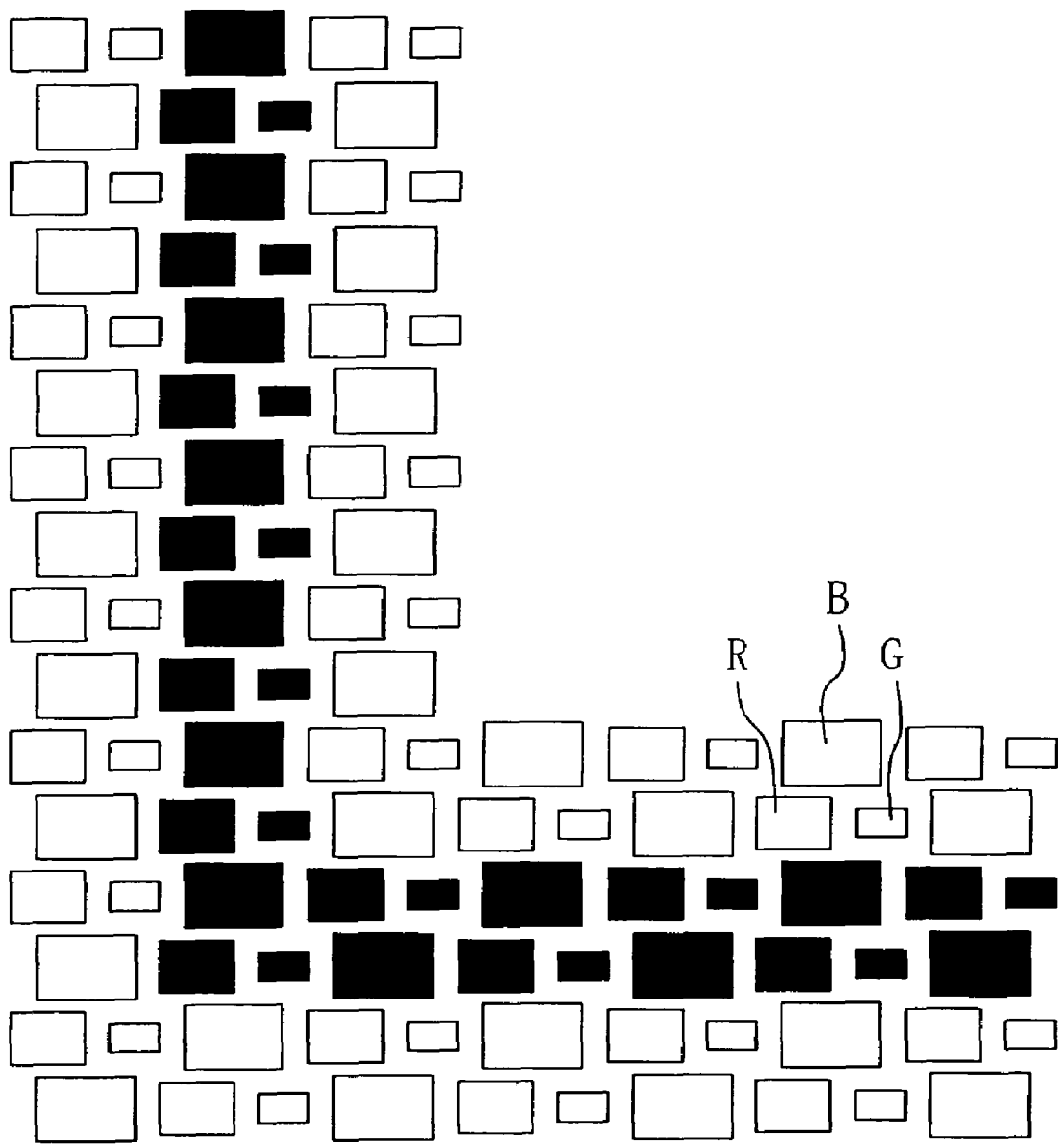
FIG. 11 a conceptual diagram illustrating the letter L produced by the organic EL display device including the light emitting regions arranged in a true delta configuration.

FIG. 11 is a conceptual diagram illustrating the letter L produced by the organic EL display device including the light emitting regions arranged in the true delta configuration of the prior art.

As shown in FIG. 11, in the organic EL display device including the light emitting regions of the conventional true delta configuration, fine jagged edges are observed along the displayed vertical and horizontal lines constructing the letter L. Therefore, the organic EL display device of the true delta configuration cannot display vertical and horizontal lines of uniform thickness.

On the other hand, as shown in FIGS. 6A and 6B, the organic EL display device 1 of the present preferred embodiment preferably includes the substantially rectangular pixels 60 arranged in a matrix configuration, in each of which the light emitting regions 70R, 70G and 70B are arranged in the almost delta configuration. Therefore, the second side 70B2 of the light emitting region 70B is collinear with the second side 70R2 of the light emitting region 70R. The fourth side 70B4 of the light emitting region 70B is collinear with the fourth side 70G4 of the light emitting region 70G. Further, the third side 70R3 of the light emitting region 70R is collinear with the third side 70G3 of the light emitting region 70G. Therefore, as shown in FIG. 10, the organic EL display device 1 of the present preferred embodiment does not have the jagged edges along the vertical and horizontal lines unlike the conventional organic EL display device of the true delta configuration, thereby displaying the vertical and horizontal lines of uniform thickness.

In the organic EL display device 1, the light emitting regions 70R, 70G and 70B are arranged in the almost delta configuration and the centers of gravity of the light emitting regions 70R, 70G and 70B form a triangle. Therefore, in the same manner as the organic EL display device including the light emitting regions arranged in the true delta configuration, the organic EL display device 1 allows display of smoother slanting lines than those produced by the organic EL display device of the stripe configuration. Therefore, the organic EL display device 1 allows sharper display of pictures composed of a relatively large number of slanting lines.

As described above, the organic EL display device 1 of the present preferred embodiment is capable of clearly displaying vertical lines, horizontal lines and slanting lines with high definition, thereby allowing image display of high quality.

The pixels 60 are preferably arranged so as not to overlap the source signal lines 12 and the gate signal lines 11. By so doing, the surface of the EL light emitting layer 42 becomes flat and the occurrence of interference fringes in the displayed image is effectively prevented. Therefore, clear image display is achieved without color drift. If the pixels 60 overlap the source signal lines 12 or the gate signal lines 11, the surface of the EL light emitting layer 42 becomes uneven, thereby causing interference fringes in the displayed image. If the interference fringes occur in the displayed image, color drift occurs in the image and the resulting image display decreases in quality.

Each of the pixels 60 preferably includes the light emitting regions 70R, 70G and 70B arranged in the same configuration. For example, if the configuration of the light emitting regions 70R, 70G and 70B differs line by line, or column by column, the subpixels are not aligned periodically and significant interference fringes are observed.

In the present preferred embodiment, the explanation is made using the active matrix organic EL display device 1 as an example of the display device of the present invention. However, the present invention is not limited thereto. For example, the display device may be a passive matrix organic EL display device or other suitable type of display device.

According to the present preferred embodiment, both image display and text display are achieved satisfactorily. In particular, the display device is suitable for the case where the text display is more frequently carried out.

Figure 12:
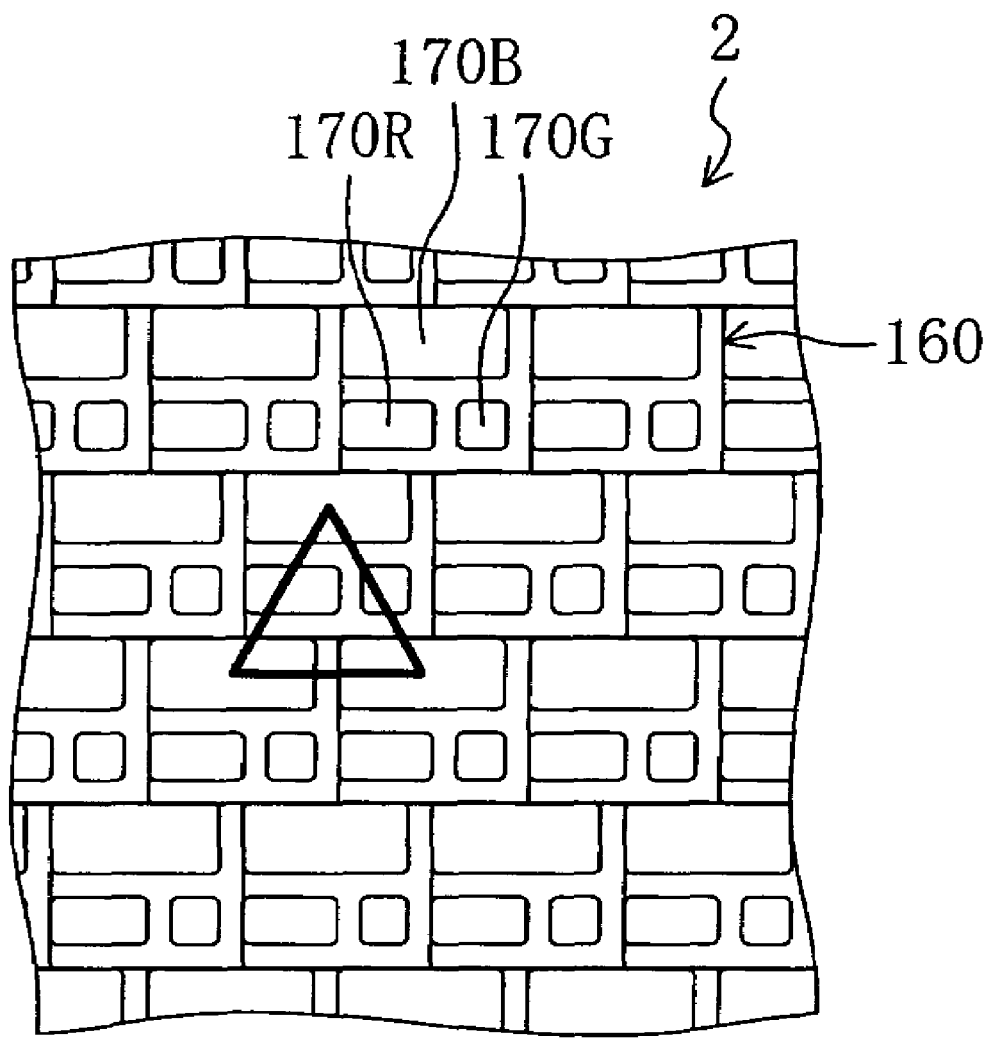
FIG. 12 is a schematic plan view illustrating the configuration of pixels in an organic EL display device according to a second preferred embodiment of the present invention.

FIG. 12 is a schematic plan view illustrating pixels 160 of an organic EL display device 2 according to a second preferred embodiment of the present invention.

Figure 19:
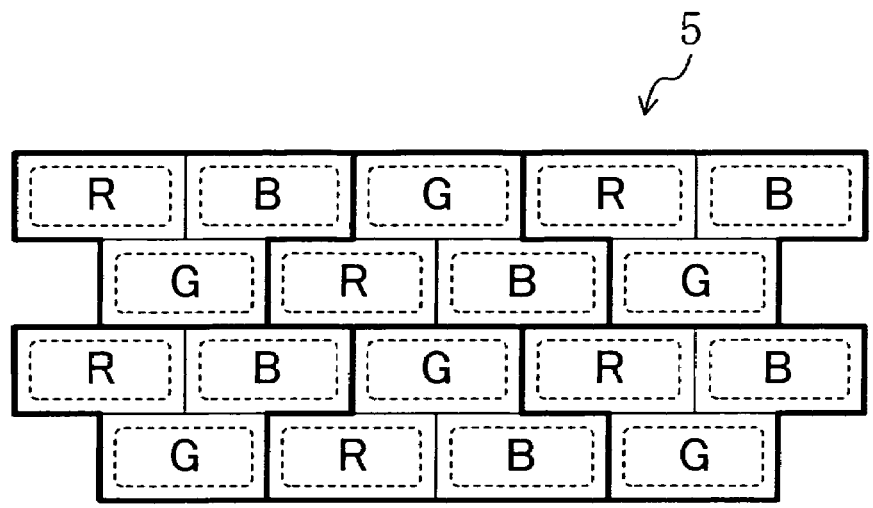
Figure 20:
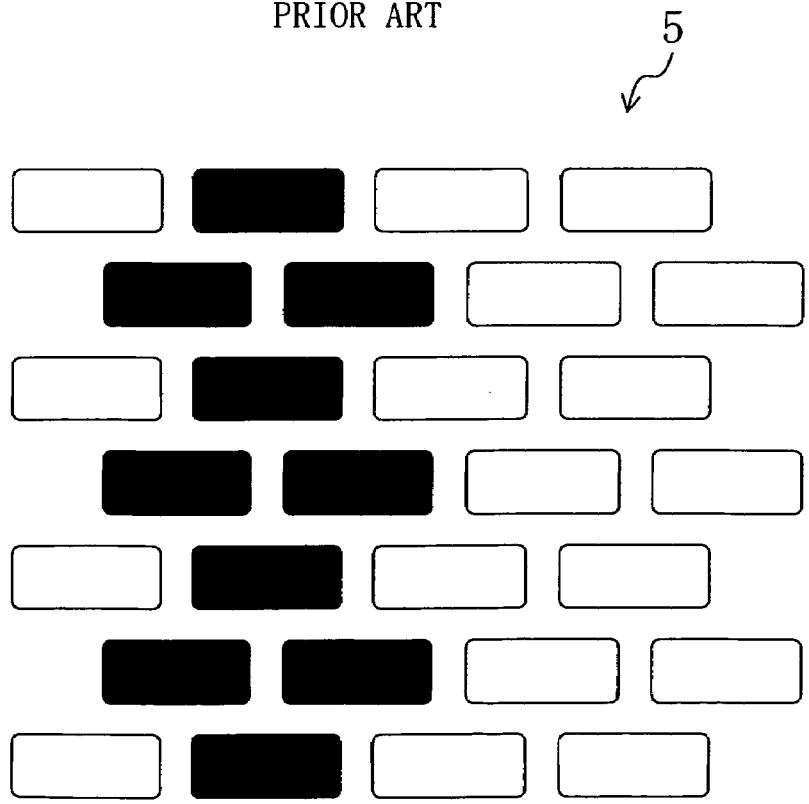

As shown in FIG. 12, the organic EL display device 2 includes a plurality of pixels 160 arranged in an almost delta configuration, i.e., each of the pixels 160 is substantially rectangular instead of being T-shaped or inverted T-shaped as in the conventional device of FIG. 19. That is, the pixels 160 are arranged such that they are misaligned with each other by one half of the width thereof along the vertical direction. Each of the pixels 160 includes a light emitting region 170R, a light emitting region 170G and a light emitting region 170B. As shown in FIG. 12, the light emitting regions which emit the same color light are arranged such that the centers of gravity of adjacent three of the light emitting regions form a regular triangle. The structure of the organic EL display device 2 is preferably the same as that of the organic EL display device 1 of the first preferred embodiment except that the pixels 160 are arranged in the above-described configuration. Now, a detailed explanation of the configuration of the pixels 160 will be provided.

As described above, in the organic EL display device 2, the light emitting regions are arranged such that the centers of gravity of adjacent three of the light emitting regions which emit the same color light form a regular triangle. Therefore, the organic EL display device 2 allows display of smoother slanting lines than those produced by the organic El display device 1 of the first preferred embodiment. The organic EL display device 2 realizes sharper display of pictures composed of relatively many slanting lines.

Figure 13:
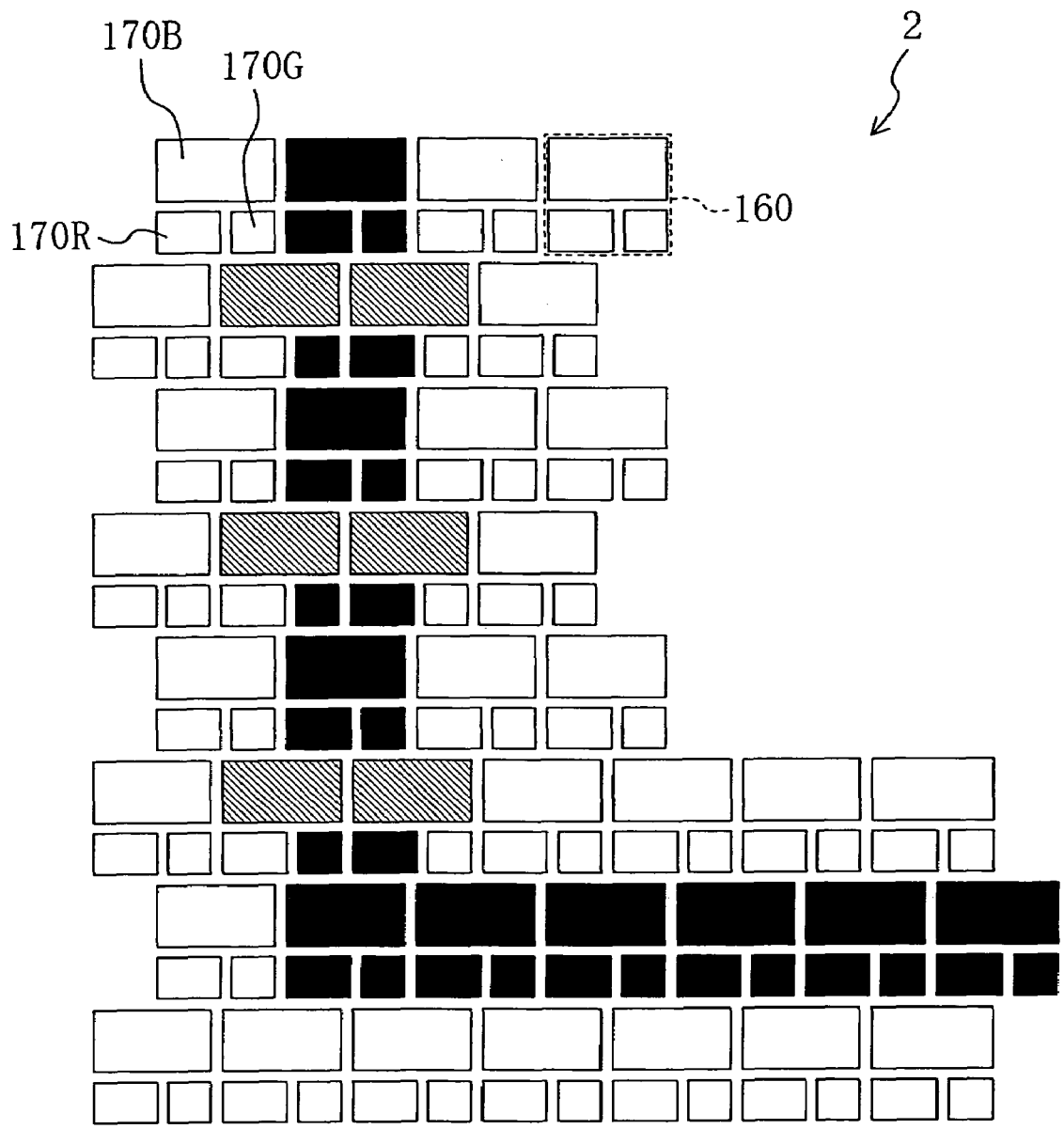
FIG. 13 is a conceptual diagram illustrating the letter L produced by the organic EL display device of the second preferred embodiment of the present invention.

The organic EL display device 2 also allows displaying smooth vertical and horizontal lines. FIG. 13 is a conceptual diagram illustrating the letter L produced by the organic EL display device 2. As shown in FIG. 13, the bottom sides of the light emitting regions 170R and 170G are collinear with each other. Therefore, jagged edges are hardly present along the horizontal lines produced by the organic EL display device 2. As to the vertical lines, data for a single light emitting region 170B is divided into two adjacent light emitting regions 170B as shown in FIG. 13 by matrix processing, for example. As a result, even if the letter L is displayed by an extra fine line, the jagged edges are less likely to be recognized. Thus, the organic EL display device 2 is suitable for displaying not only pictures, but also text because fine and smooth vertical and horizontal lines are displayed. The matrix processing mentioned above is preferably performed by arithmetically processing image information for the intended pixel in consideration with image information for adjacent pixel and time-sharing drive system. Consequently, the image information is output as more suitable one for display.

Figure 14A:
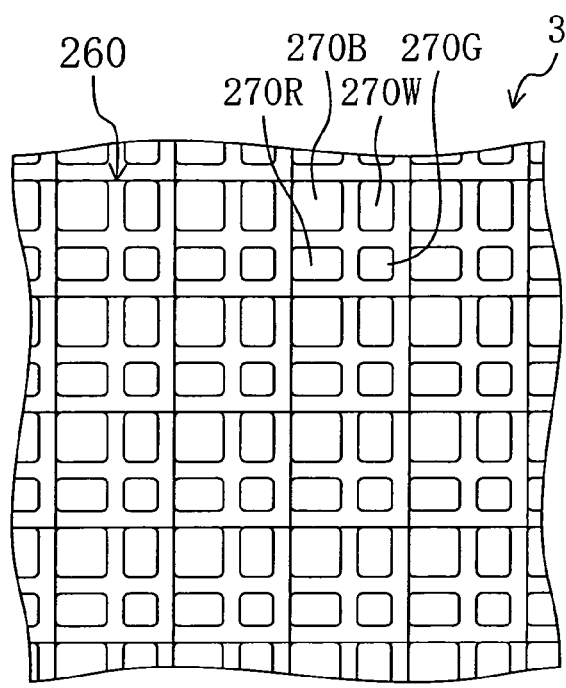
FIGS. 14A and 14B are schematic plan views illustrating the configuration of pixels in an organic EL display device according to a third preferred embodiment of the present invention.
Figure 14B:
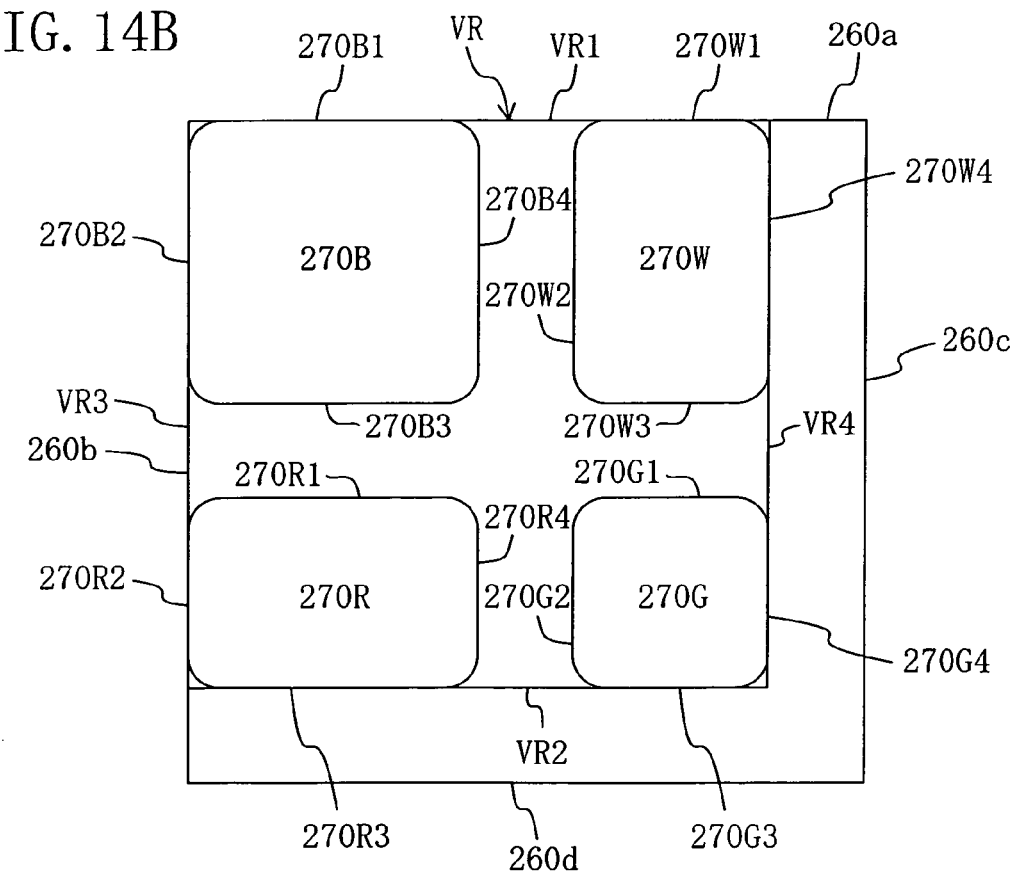

FIGS. 14A and 14B are schematic sectional views illustrating pixels 260 of an organic EL display device 3 according to a third preferred embodiment of the present invention.

As shown in FIGS. 14A and 14B, the organic EL display device 3 includes a plurality of pixels 260 arranged in a matrix configuration. Each of the pixels 260 includes a light emitting region 270R, a light emitting region 270G, a light emitting region 270B and a light emitting region 270W. The structure of the organic EL display device 3 is the same as that of the organic EL display device 1 of the first preferred embodiment except for the presence of the light emitting regions 270W in the pixels 260. In the present preferred embodiment, a detailed explanation is given of the structure and configuration of the light emitting regions in the pixels 260.

The organic EL display device 3 is provided with light emitting regions 270R, 270G, 270B which emit red light, blue light and green light, respectively. In addition to the 270R, 270G, 270B, light emitting regions 270W which emit white (W) light are also formed. With the presence of the light emitting regions 270W, a greater dynamic range of luminance is obtained, thereby allowing visual representation with more brightness, clearness and brilliance. The light emitting regions 270R, 270G, 270B and 270W are different in area from each other. The light emitting regions 270B have the largest area, while the light emitting regions 270G have the smallest area.

In general, the light emitting regions 270R, 270G and 270B are different from each other in luminance attenuation characteristic (a gradual decrease in luminance of the light emitting regions 270R, 270G and 270B while white display is performed on the entire display region of the organic EL display device 3). If the light emitting regions 270R, 270G and 270B have the same area, the rate of luminance attenuation of the light emitting region 270B is the highest, while that of the light emitting region 270G is the lowest. If the light emitting region 270B which is the highest in luminance attenuation rate is provided with the largest area, while the light emitting region 270G which is the lowest in luminance attenuation rate is provided with the smallest area as in the organic EL display device 3, a voltage applied to the light emitting region 270B whose luminance decreases at a high rate is reduced, thereby reducing the luminance attenuation rate of the light emitting region 270B. As a result, the light emitting regions 270R, 270G and 270B are more equalized in luminance attenuation rate, thereby efficiently inhibiting variations in color balance over operating time, as well as the occurrence of color drift in the displayed image. Thus, according to the above-described configuration, the organic EL display device 3 is provided with more increased life. The luminance attenuation of the light emitting regions 270W for white light emission hardly affects the color balance.

In the organic EL display device 3, a set of the substantially rectangular light emitting regions 270R, 270G, 270B and 270W is surrounded by a virtual rectangle VR. A first side VR1 of the virtual rectangle VR is in contact with a first side 270B1 of the light emitting region 270B and a first side 270W1 of the light emitting region 270W. A second side VR2 of the virtual rectangle VR that is parallel or substantially parallel to the first side VR1 is in contact with a third side 270R3 of the light emitting region 270R and a third side 270G3 of the light emitting region 270G. A third side VR3 of the virtual rectangle VR that is perpendicular or substantially perpendicular to the first side VR1 is in contact with a second side 270B2 of the light emitting region 270B and a second side 270R2 of the light emitting region 270R. Further, a fourth side VR4 of the virtual rectangle VR that is parallel or substantially parallel to the third side VR3 is in contact with a fourth side 270W4 of the light emitting region 270W and a fourth side 270G4 of the light emitting region 270G.

A fourth side 270B4 of the light emitting region 270B faces a second side 270W2 of the light emitting region 270W. A fourth side 270R4 of the light emitting region 270R faces a second side 270G2 of the light emitting region 270G. A third side 270B3 of the light emitting region 270B faces a first side 270R1 of the light emitting region 270R. Further, a third side 270W3 of the light emitting region 270W faces a first side 270G1 of the light emitting region 270G. A gap among the light emitting regions 270R, 270G, 270B and 270W is defined as a non-emission region.

The first side VR1 of the virtual rectangle VR is in contact with a side 260a of the pixel 260, while the third side VR3 of the virtual rectangle VR is in contact with a side 260b of the pixel 260. The second side VR2 of the virtual rectangle VR and a side 260d of the pixel 260 are positioned to have an interval therebetween, and so are the fourth side VR4 of the virtual rectangle VR and a side 260c of the pixel 260. The interval is where the bank 30 is formed. In this specification, the above-described configuration of the light emitting regions is referred to as "X configuration".

In the same manner as the organic EL display device 1 of the first preferred embodiment, the organic EL display device 3 including the light emitting regions 270R, 270G, 270B and 270W arranged in the X configuration increases the ratio of the total area of the light emitting regions to the pixel area more than the conventional organic EL display device of the stripe configuration. Therefore, the organic EL display device 3 achieves a high aperture ratio, thereby realizing higher luminance.

In organic EL display device 3, the pixels 260 are arranged in a matrix configuration. Further, the first side 270B1 of the light emitting region 270B is collinear with the first side 270W1 of the light emitting region 270W, while the third side 270R3 of the light emitting region 270R is collinear with the third side 270G3 of the light emitting region 270G. Therefore, the organic EL display device 3 allows display of smooth horizontal lines that are free from jagged edges. Further, the second side 270B2 of the light emitting region 270B is collinear with the second side 270R2 of the light emitting region 270R, while the fourth side 270W4 of the light emitting region 270W is collinear with the fourth side 270G4 of the light emitting region 270G. Therefore, the organic EL display device 3 allows display of smooth vertical lines that are free from jagged edges. The organic EL display device 3 includes the light emitting regions 270R, 270G, 270B and 270W which emit lights of red, green, blue and white, respectively. However, the display device of the present invention is not limited thereto.

For example, in addition to the conventional light emitting regions R, G and B, a fourth light emitting region which emits light of a color described by chromaticity coordinates (x4, y4) may be provided. As long as the chromaticity coordinates of light emitted from the light emitting region G are (xG, yG) and those of light emitted from the light emitting region B are (xB, yB), and if xB<x4<xG and yB<y4<yG are satisfied, the number of displayable colors increases. This allows color-rich display.

If the chromaticity coordinates (x4, y4) of light emitted from the fourth light emitting region are located between the chromaticity coordinates (xR, yR) of the light emitting region R and the chromaticity coordinates (xG, yG) of the light emitting region G, the fourth light emitting region emits reddish orange light. This allows vivid, shiny and brilliant visual representation.

In the organic EL display device 3, the fourth side 270B4 of the light emitting region 270B is preferably substantially collinear with the fourth side 270R4 of the light emitting region 270R, while the second side 270W2 of the light emitting region 270W is preferably substantially collinear with the second side 270R2 of the light emitting region 270G. However, the present invention is not limited thereto.

In the organic EL display device 3, the intervals among the light emitting regions 270R, 270G, 270B and 270W preferably have the same width, but the present invention is not limited thereto. For example, in consideration of a positional relationship with other components such as TFTs and for design purpose, the intervals among the light emitting regions may be varied from each other.

Figure 15A:
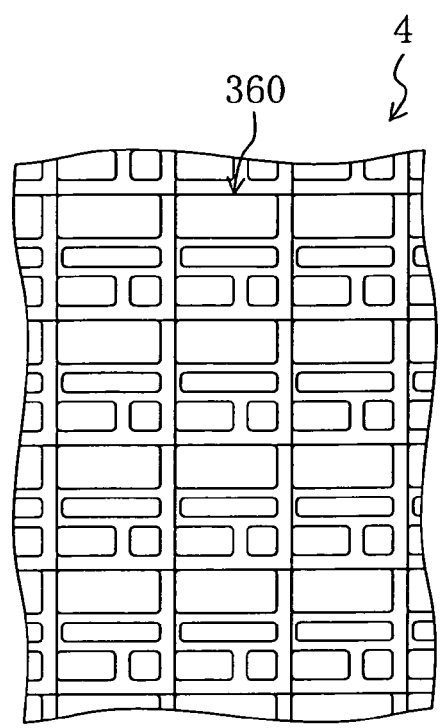
FIGS. 15A and 15B are schematic plan views illustrating the configuration of pixels in an organic EL display device according to a fourth preferred embodiment of the present invention.
Figure 15B:
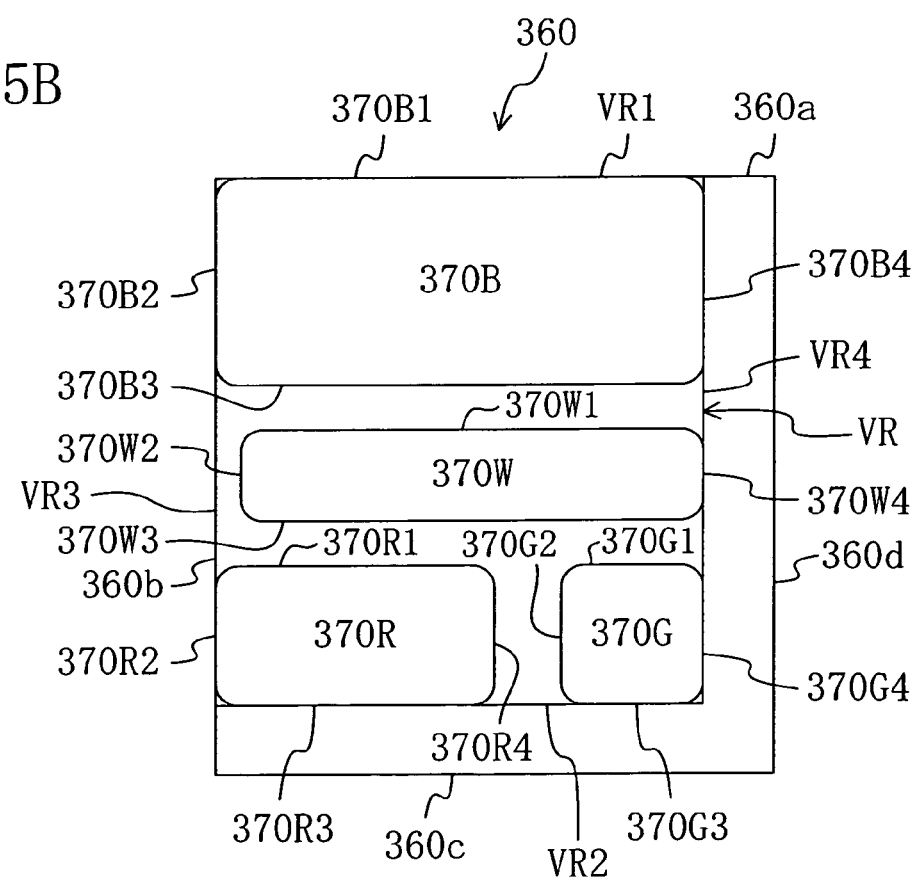

FIGS. 15A and 15B are schematic sectional views illustrating pixels 360 of an organic EL display device 4 according to a fourth preferred embodiment of the present invention.

As shown in FIGS. 15A and 15B, the organic EL display device 4 includes a plurality of pixels 360 arranged in a matrix configuration. Each of the pixels 360 includes four light emitting regions 370R, 370G, 370B and 370W. The structure of the organic EL display device 4 is preferably the same as that of the organic EL display device 1 of first preferred embodiment except for the presence of the light emitting regions 370W in the pixels 360. Now, a detailed explanation of the structure and configuration of the light emitting regions in the pixels 360 will be provided.

The light emitting regions 370R, 370G, 370B and 370W are different in area from each other. The light emitting regions 370B have the largest area, while the light emitting regions 370G have the smallest area. Therefore, luminance attenuation of the light emitting regions 370R, 370G, 370B and 370W occurs substantially at the same rate. Thus, the organic EL display device 4 is provided with long life as the organic EL display device 1 is.

In the organic EL display device 4, the substantially rectangular light emitting regions 370R, 370G, 370B and 370W are surrounded by a virtual rectangle VR. A first side VR1 of the virtual rectangle VR is in contact with a first side 370B1 of the light emitting region 370B. A second side VR2 of the virtual rectangle VR that is parallel or substantially parallel to the first side VR1 is in contact with a third side 370R3 of the light emitting region 370R and a third side 370G3 of the light emitting region 370G. A third side VR3 of the virtual rectangle VR that is perpendicular or substantially perpendicular to the first side VR1 is in contact with a second side 370B2 of the light emitting region 370B and a second side 370R2 of the light emitting region 370R, but not with a second side 370W2 of the light emitting region 370W. A fourth side VR4 of the virtual rectangle VR that is parallel or substantially parallel to the third side VR3 is in contact with a fourth side 370B4 of the light emitting region 370B, a fourth side 370G4 of the light emitting region 370G and a fourth side 370W4 of the light emitting region 370W. In the organic EL display device 4, the fourth side VR4 is in contact with the fourth side 370W4 of the light emitting region 370W, but the present invention is not limited thereto. For example, the fourth side 370W4 may be spaced apart from the fourth side VR4.

A third side 370B3 of the light emitting region 370B faces a first side 370W1 of the light emitting region 370W. A third side 370W3 of the light emitting region 370W faces a first side 370R1 of the light emitting region 370R and a first side 370G1 of the light emitting region 370G. A fourth side 370R4 of the light emitting region 370R faces a second side 370G2 of the light emitting region 370G.

The first side VR1 of the virtual rectangle VR is in contact with a side 360a of the pixel 360. The third side VR3 of the virtual rectangle VR is in contact with a side 360b of the pixel 360. The second side VR2 of the virtual rectangle VR and a side 360d of the pixel 360 are positioned to have an interval therebetween, and so are the fourth side VR4 of the virtual rectangle VR and a side 360c of the pixel 360. The interval is where the bank 30 is located. That is, the light emitting regions 370R, 370G and 370B are arranged in the almost delta configuration and the fourth light emitting region 370W is provided within the virtual rectangle VR.

In the organic EL display device 4, the light emitting regions 370R, 370G and 370B are arranged in the almost delta configuration. Therefore, in the same manner as the organic EL display device 1 of the first preferred embodiment, the organic EL display device 4 increases the ratio of the total area of the light emitting regions to the pixel area more than the conventional organic EL display device including the light emitting regions arranged in the stripe configuration. Thus, the organic EL display device 4 achieves a high aperture ratio, thereby realizing higher luminance.

Figure 16:
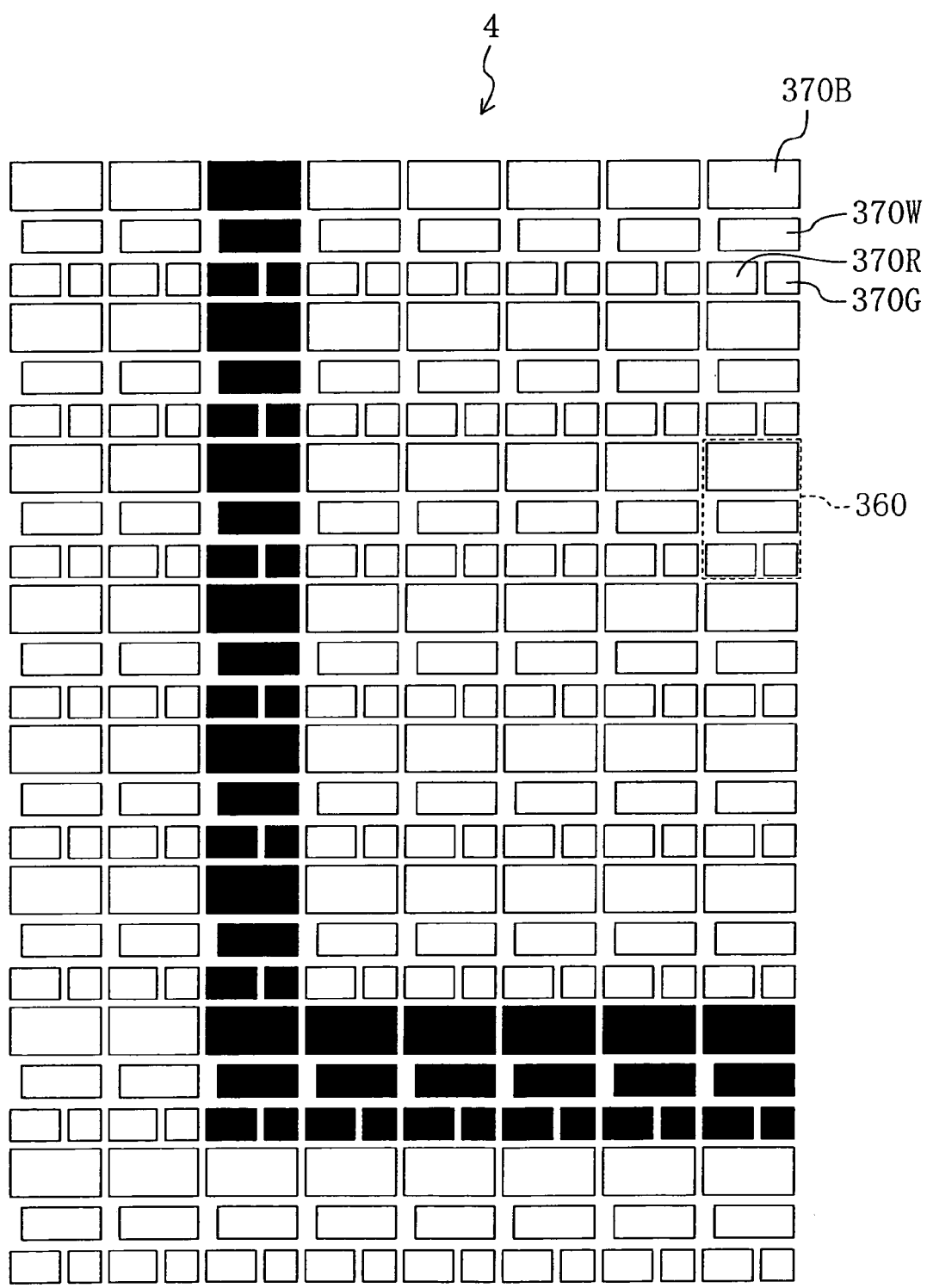
FIG. 16 is a conceptual diagram illustrating the letter L produced by the organic EL display device according to the fourth preferred embodiment of the present invention.

FIG. 16 is a conceptual diagram illustrating the letter L produced by the organic EL display device 4.

Referring to FIG. 16, an explanation of the effect of the organic EL display device 4 on visual display is provided. In the organic EL display device 4, a plurality of pixels 360 are arranged in a matrix configuration. The third side 370R3 of the light emitting region 370R is collinear with the third side 370G3 of the light emitting region 370G. Therefore, as shown in FIG. 16, the organic EL display device 4 allows display of smooth horizontal lines that are free from jagged edges. Further, the fourth side 370W4 of the light emitting region 370W is collinear with the fourth side 370G4 of the light emitting region 370G and the fourth side 370B4 of the light emitting region 370B, while the second side 370B2 of the light emitting region 370B is collinear with the second side 370R2 of the light emitting region 370R. Therefore, as shown in FIG. 16, the organic EL display device 4 allows display of smooth vertical lines that are free from significant jagged edges.

In the organic EL display device 4, the light emitting regions 370R, 370G and 370B are arranged in the almost delta configuration. Therefore, in the same manner as the case where the light emitting regions are arranged in the true delta configuration, the organic EL display device 4 displays smoother slanting lines than those produced by the conventional organic EL display device including the light emitting regions arranged in the stripe configuration. Thus, the organic EL display device 4 allows sharper display of pictures composed of relatively many slanting lines. As described above, the organic EL display device 4 allows display of smooth vertical lines, horizontal lines and slanting lines, thereby realizing image display of higher quality.

Figure 17:
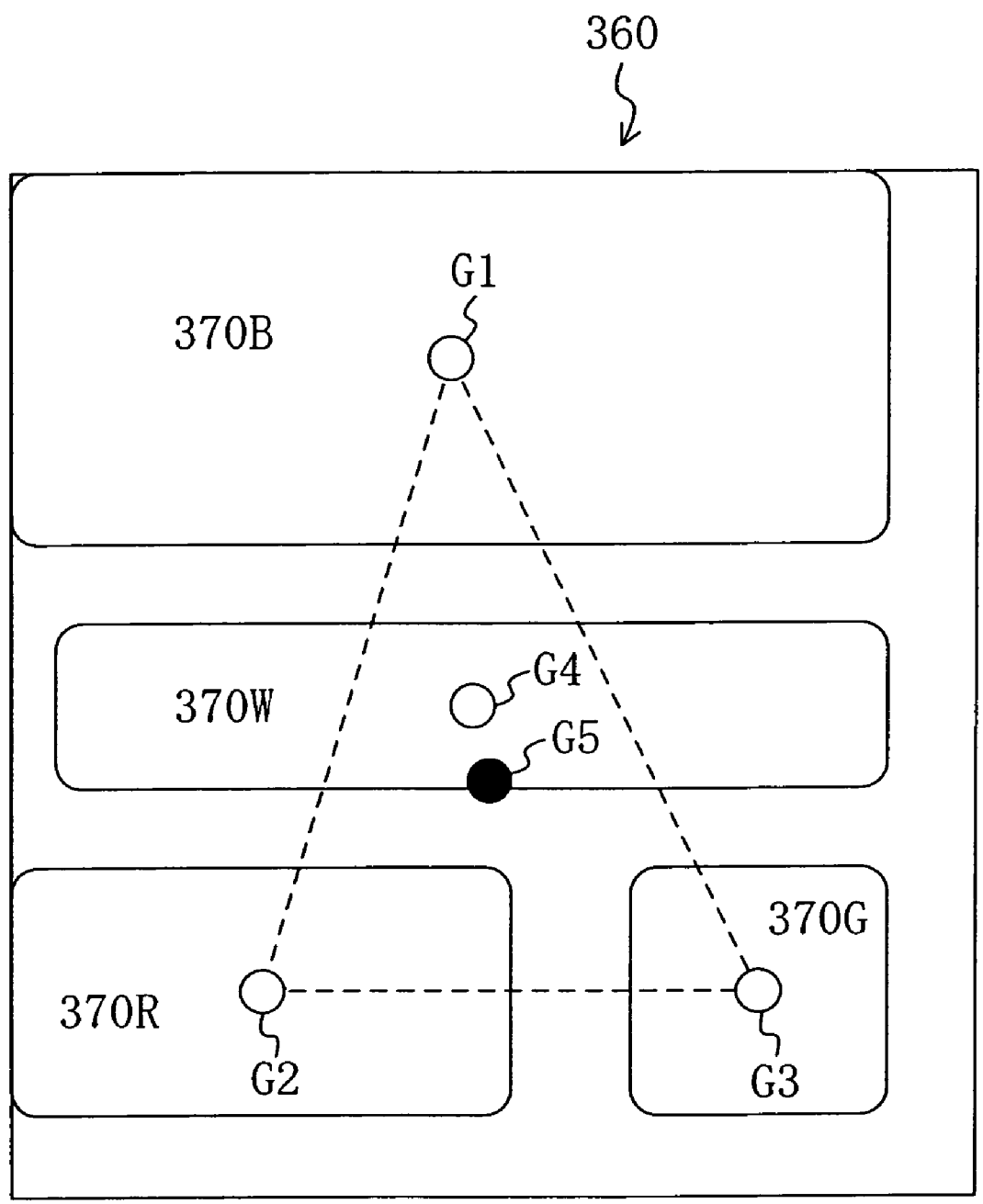
FIG. 17 is a schematic plan view illustrating a positional relationship among the centers of gravity of the light emitting regions in the organic EL display device of the fourth preferred embodiment of the present invention.

FIG. 17 is a schematic plan view illustrating the positional relationship among the centers of gravity of the light emitting regions in the organic EL display device 4.

In the organic EL display device 4, the center of gravity G4 of the light emitting region 370W is positioned within a triangle formed by connecting the centers of gravity G2, G3 and G1 of the light emitting regions 370R, 370G and 370B. Therefore, the center of gravity G4 comes very close to the center of luminance G5 of the pixel 360. The center of luminance G5 is an apparent center of brightness of a dot displayed by emitting light only by the light emitting regions R, G, B and W in a single pixel. Therefore, the closer the center of gravity G4 is to the center of luminance G5, the greater the prevention of color drift in the pixel 360 when all the light emitting regions 370R, 370G and 370B in the pixel 360 are in the light emitting state.

The longer the distance from the center of gravity G4 to the center of luminance G5 is, the more significant distortion and color drift occur in graphics produced by light emission from the light emitting regions 370R, 370G and 370B.

Figure 18:
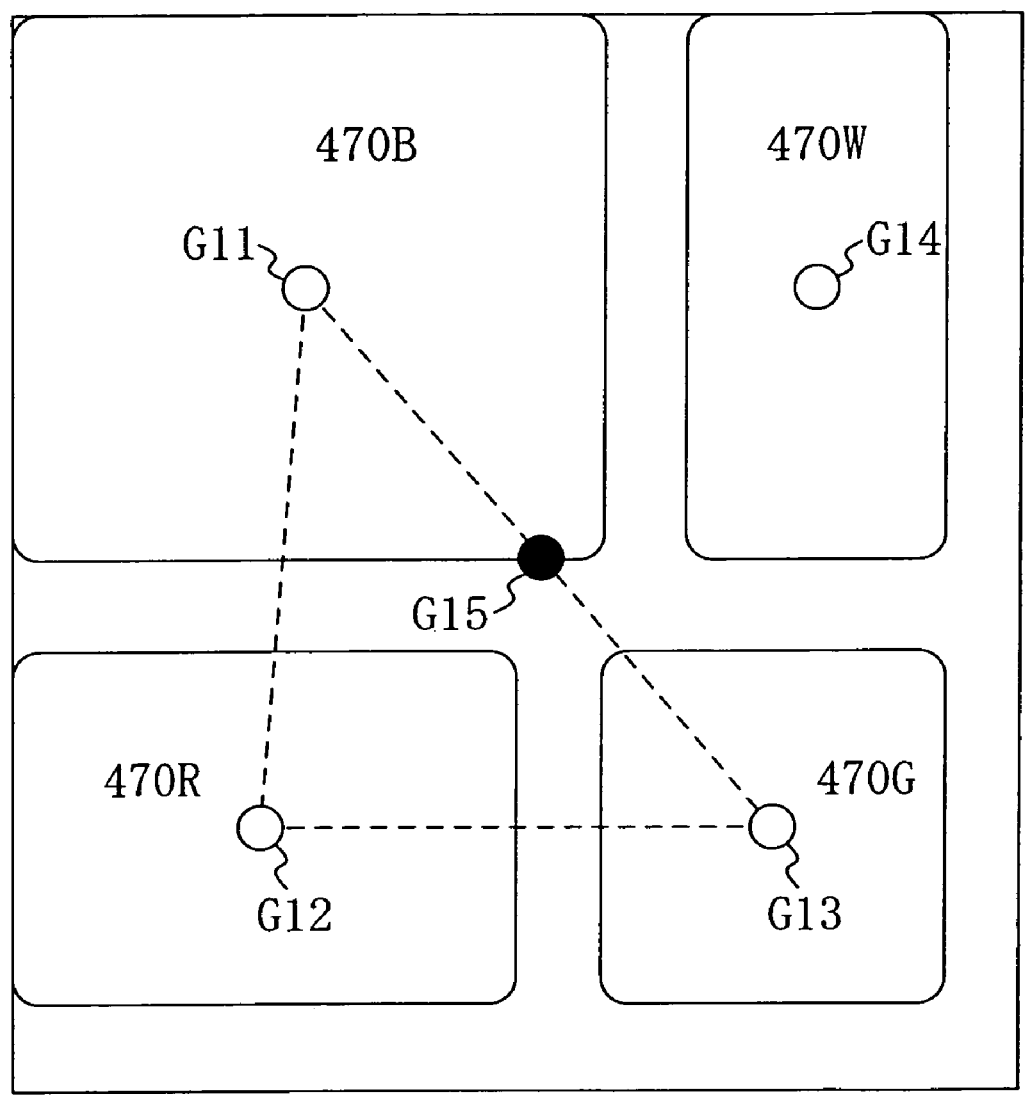
FIG. 18 is a schematic plan view illustrating the configuration of pixels in which the center of gravity of a light emitting region for white light emission is located outside a triangle formed by connecting the centers of gravity of a light emitting region for red light emission, a light emitting region for green light emission and a light emitting region for blue light emission.

FIG. 18 is a schematic plan view illustrating a pixel in which the center of gravity G14 of a light emitting region 470W is positioned outside a triangle formed by connecting the centers of gravity of G12, G13 and G11 of light emitting regions 470R, 470G and 470B.

In an organic EL display device including the pixel shown in FIG. 18, unlike the organic EL display device 4, the center of gravity G14 is far away from the center of luminance G15. In such a case, when all the light emitting regions in a single pixel are operated to display a white dot, the dot is distorted in the direction from the center of luminance G15 to the center of gravity G14, and visually recognized as a blurred dot. Thus, this organic EL display device cannot display a clear dot.

Thus, as described above, the organic EL display device 4 allows display of a clear dot without significant color drift and distortion.

If the light emitting region 370W is higher in luminance than the light emitting regions 370R, 370G and 370B, i.e., the most luminous light emitting region is the light emitting region 370W, the distance from the center of gravity G4 to the center of luminance G5 is further reduced and light emitting density per luminescent spot increases. Therefore, light emission is apparently concentrated at a single spot, thereby allowing display of a clear dot with less color drift. Thus, use of the organic EL display device 4 of the fourth preferred embodiment allows for production of mobile information devices which offer high-definition display even if they are viewed at as close range as one can visually recognize the pixels or their resolution is low.

In the first to fourth preferred embodiments, explanation has been given by using the organic EL display device as an example of a display device of the present invention. However, the display device of the present invention is not limited thereto. For example, the display device may emit lights of more than four colors. Further, the display device may be a liquid crystal display device, an inorganic EL display device, a plasma display device and an LED display device. If the display device is the liquid crystal display device, the light emitting regions are regions where light passes through the color filters of different colors. Where the display device is provided with a black matrix, the light emitting regions are regions which correspond to the openings of the black matrix and each of which is applied with a voltage depending on the intended display.

In the above, preferred embodiments of the present invention have been described. However, the technical scope of the present invention is not limited to the preferred embodiments and the contents of the description. It should be understood by those skilled in the art that the preferred embodiments are provided for explanation only and the combination of the components and the steps mentioned above can be modified. Further, the modified preferred embodiments are also within the scope of the present invention.

What is claimed is:

1. A display device comprising:
a plurality of pixels each including at least three light emitting regions including a first light emitting region, a second light emitting region and a third light emitting region; wherein
at least two of said at least three light emitting regions are different in area from each other;
said at least three light emitting regions are substantially rectangular;
said at least three light emitting regions are surrounded by a virtual rectangle and a first side of the virtual rectangle is in contact with a portion of a boundary of the first light emitting region;
a second side of the virtual rectangle that is parallel or substantially parallel to the first side is in contact with portions of boundaries of the second and third light emitting regions;
a third side of the virtual rectangle that is perpendicular or substantially perpendicular to the first side is in contact with portions of boundaries of the first and second light emitting regions;
a fourth side of the virtual rectangle that is parallel or substantially parallel to the third side is in contact with portions of boundaries of the first and third light emitting regions;
the second and third light emitting regions have the same width in a direction of extension of the third side; and
the plurality of pixels are misaligned with each other by one half of the width of the pixels.

2. A display device according to claim 1, wherein each of the at least three light emitting regions are different in area from each other.

3. A display device according to claim 1, wherein the at least three light emitting regions include a blue light emitting region, a green light emitting region and a red light emitting region, wherein the blue light emitting region has the largest area and the green light emitting region has the smallest area.

4. A display device according to claim 1, wherein the at least three light emitting regions have different luminance attenuation characteristics.

5. A display device according to claim 1, wherein the at least three light emitting regions are spaced from each other by equal distances.

6. A display device according to claim 1, wherein centers of gravity of the at least three light emitting regions form a triangle.

7. A display device according to claim 1, wherein centers of gravity of the at least three light emitting regions do not form a regular triangle.

8. A display device according to claim 1, wherein left hand sides of two of the at least three light emitting regions are collinear.

9. A display device according to claim 1, wherein right hand sides of two of the at least three light emitting regions are collinear.

10. A display device according to claim 1, wherein bottom sides of two of the at least three light emitting regions are collinear.

11. A display device according to claim 1, wherein the display device is one of an organic electroluminescent display device, a liquid crystal display device, an inorganic electroluminescent display device, a plasma display device and an LED display device.

12. A display device comprising:
- at least three light emitting regions including a first light emitting region, a second light emitting region and a third light emitting region; and
- a fourth light emitting region which is arranged within the virtual rectangle; wherein
- at least two of said at least three light emitting regions are different in area from each other;
- said at least three light emitting regions are substantially rectangular;
- said at least three light emitting regions are surrounded by a virtual rectangle and a first side of the virtual rectangle is in contact with a portion of a boundary of the first light emitting region;
- a second side of the virtual rectangle that is parallel or substantially parallel to the first side is in contact with portions of boundaries of the second and third light emitting regions;
- a third side of the virtual rectangle that is perpendicular or substantially perpendicular to the first side is in contact with portions of boundaries of the first and second light emitting regions;
- a fourth side of the virtual rectangle that is parallel or substantially parallel to the third side is in contact with portions of boundaries of the first and third light emitting regions;
- the second and third light emitting regions have the same width in a direction of extension of the third side; and
- the fourth light emitting region is substantially rectangular, the fourth light emitting region has a side which is parallel to the first side and the center of gravity of the fourth light emitting region is located within a polygon defined by connecting the centers of gravity of said at least three light emitting regions.

13. A display device according to claim 12, wherein the fourth light emitting region has the highest luminance when emitting white light.

14. A display device comprising:
- at least three light emitting regions including a first light emitting region, a second light emitting region and a third light emitting region; and
- a fourth light emitting region; wherein
- at least two of said at least three light emitting regions are different in area from each other;
- said at least three light emitting regions are substantially rectangular;
- said at least three light emitting regions are surrounded by a virtual rectangle and a first side of the virtual rectangle is in contact with a portion of a boundary of the first light emitting region;
- a second side of the virtual rectangle that is parallel or substantially parallel to the first side is in contact with portions of boundaries of the second and third light emitting regions;
- a third side of the virtual rectangle that is perpendicular or substantially perpendicular to the first side is in contact with portions of boundaries of the first and second light emitting regions;
- a fourth side of the virtual rectangle that is parallel or substantially parallel to the third side is in contact with portions of boundaries of the first and third light emitting regions; and
- the second and third light emitting regions have the same width in a direction of extension of the third side.

15. A display device according to claim 14, wherein the fourth light emitting region is a white light emitting region.

16. A display device according to claim 14, wherein the fourth light emitting region is located at one of four corners of the virtual rectangle.

17. A display device according to claim 14, wherein the fourth light emitting region is located between the at least three light emitting regions.

18. A display device according to claim 14, wherein the center of gravity of the fourth light emitting region is located within a triangle defined by connecting the centers of gravity of the at least three light emitting regions.

19. A display device according to claim 14, wherein the center of gravity of the fourth light emitting region is located outside of a triangle defined by connecting the centers of gravity of the at least three light emitting regions.

20. A display device comprising:
- at least three light emitting regions including a first light emitting region, a second light emitting region and a third light emitting region; wherein
- at least two of said at least three light emitting regions are different in area from each other;
- said at least three light emitting regions are substantially rectangular;
- said at least three light emitting regions are surrounded by a virtual rectangle and a first side of the virtual rectangle is in contact with a portion of a boundary of the first light emitting region;
- a second side of the virtual rectangle that is parallel or substantially parallel to the first side is in contact with portions of boundaries of the second and third light emitting regions;
- a third side of the virtual rectangle that is perpendicular or substantially perpendicular to the first side is in contact with portions of boundaries of the first and second light emitting regions;
- a fourth side of the virtual rectangle that is parallel or substantially parallel to the third side is in contact with portions of boundaries of the first and third light emitting regions;
- the second and third light emitting regions have the same width in a direction of extension of the third side; and
- the at least three light emitting regions are arranged in an almost delta configuration.

21. A display device comprising:
- a plurality of pixels each including at least four light emitting regions including a first light emitting region, a second light emitting region, a third light emitting region and a fourth light emitting region; wherein
- at least two of said at least four light emitting regions are different in area from each other;
- said at least four light emitting regions are substantially rectangular;

said at least four light emitting regions are surrounded by a virtual rectangle and a first side of the virtual rectangle is in contact with portions of boundaries of the first and second light emitting regions;

a second side of the virtual rectangle that is parallel or substantially parallel to the first side is in contact with portions of boundaries of the third and fourth light emitting regions;

a third side of the virtual rectangle that is perpendicular or substantially perpendicular to the first side is in contact with portions of the boundaries of the first and third light emitting regions;

a fourth side of the virtual rectangle that is parallel or substantially parallel to the third side is in contact with portions of boundaries of the second and fourth light emitting regions;

the first and second light emitting regions have the same width in a direction of extension of the third side;

the third and fourth light emitting regions have the same width in a direction of extension of the third side; and the plurality of pixels are misaligned with each other by one half of the width of the pixels.

* * * * *